United States Patent [19]
Arimoto

[11] Patent Number: 6,093,882
[45] Date of Patent: Jul. 25, 2000

[54] METHOD OF PRODUCING A SOLAR CELL; A SOLAR CELL AND A METHOD OF PRODUCING A SEMICONDUCTOR DEVICE

[75] Inventor: Satoshi Arimoto, Tokyo, Japan

[73] Assignee: Mitsubishi Denki Kabushiki Kaisha, Tokyo, Japan

[21] Appl. No.: 09/352,607

[22] Filed: Jul. 13, 1999

Related U.S. Application Data

[62] Division of application No. 08/938,615, Sep. 26, 1997.

[30] Foreign Application Priority Data

Dec. 20, 1996 [JP] Japan .................................. 8-341595
May 30, 1997 [JP] Japan .................................. 9-142406

[51] Int. Cl.[7] .............................................. H01L 31/0236
[52] U.S. Cl. ............................... 136/56; 438/29; 438/39; 438/71; 257/452; 257/466
[58] Field of Search ..................... 136/252, 255, 136/256, 261; 438/57, 353, 354, 355, 403, 404, 405, 39, 29, 71; 257/452, 466

[56] References Cited

U.S. PATENT DOCUMENTS

| | | | |
|---|---|---|---|
| 4,377,901 | 3/1983 | David et al. ........................ | 29/572 |
| 4,478,879 | 10/1984 | Baraona et al. ..................... | 427/85 |
| 5,082,791 | 1/1992 | Micheels et al. .................... | 437/2 |
| 5,665,175 | 9/1997 | Safir ................................ | 136/255 |
| 5,928,438 | 7/1999 | Salami et al. ...................... | 136/255 |

FOREIGN PATENT DOCUMENTS

| | | |
|---|---|---|
| 2346985 | 7/1991 | Japan . |
| 2467347 | 10/1992 | Japan . |
| 2572114 | 10/1993 | Japan . |

OTHER PUBLICATIONS

Gary C. Cheek et al., Thick–Film Metallization for Solar Cell Applications, IEE Transactions on Electron Devices, vol. ED–31, No. 5, May 1984, pp. 602–609.
The Conference Record of the Seventeenth IEEE Photovoltaic Specialist Conference–1984, Hyatt–Orlando Hotel Kissimmee, Florida, May 1–4 1984, Critical Processing Parameter for Screen Printer Semicrystalline Silicone Solar Cells, pp. 1347–1351.

*Primary Examiner*—Nam Nguyen
*Assistant Examiner*—Michael K. Miggins
*Attorney, Agent, or Firm*—Birch, Stewart, Kolasch & Birch, LLP

[57] ABSTRACT

A solar cell and a method of producing the same which realizes electrical separation of the p n junction in a simple manner, and a method of producing a semiconductor device a method of producing a semiconductor device in which an electrode is formed by using a metallic paste material on a substrate covered with a silicon nitride film or a titanium oxide film, wherein a glass paste 104 composed mainly of glass which has a property of melting silicon is provided on an n type diffusion layer 101 in the p n junction; the substrate is baked so that penetration of the n type diffusion layer 101 is effected by the glass paste; aluminum is diffused in the n type diffusion layer 101 below a p electrode 103 formed of an aluminum silver paste to thereby form a p type inversion layer 105 inverted to a p type, whereby the electrical separation of the p n junction can be realized. Further, when a metallic paste material is provided on an insulating film and the metallic paste material is baked, the material penetrates the insulating film to electrically contact with the semiconductor substrate.

9 Claims, 13 Drawing Sheets

FIGURE 8
(a) 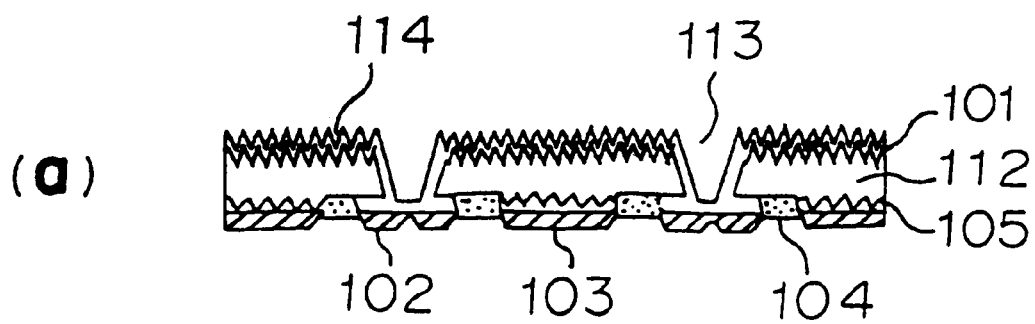
(b) 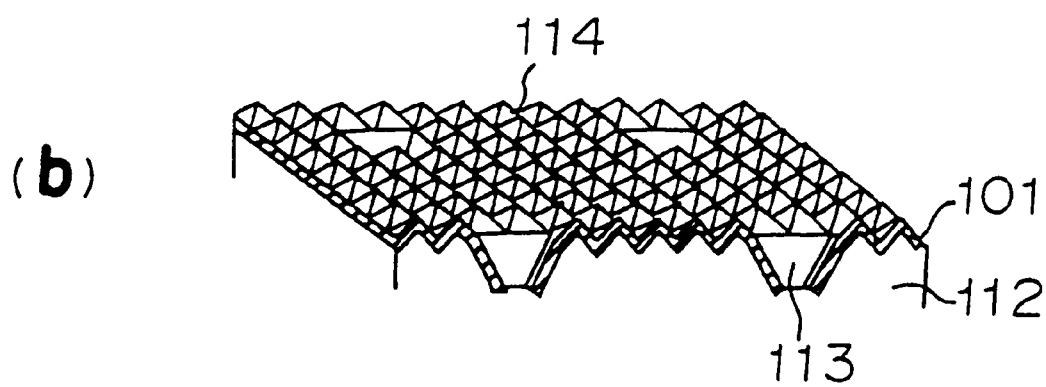
(c) 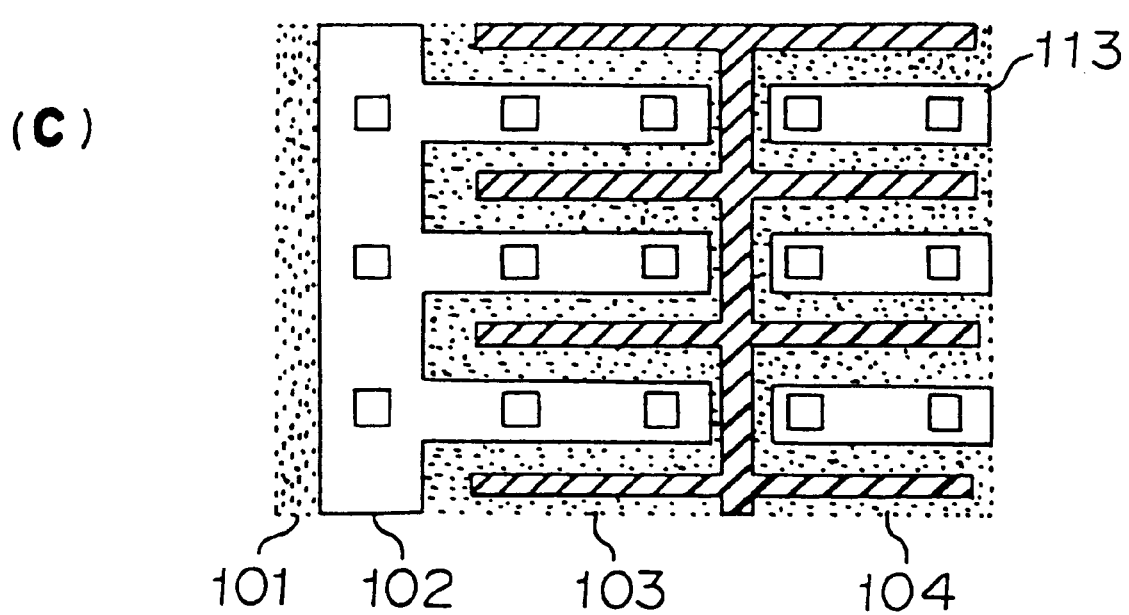

METHOD OF PRODUCING A SOLAR CELL; A SOLAR CELL AND A METHOD OF PRODUCING A SEMICONDUCTOR DEVICE

This application is a divisional of copending application Ser. No. 08/938,615, filed on Sep. 26, 1997 now pending, the entire contents of which are hereby incorporated by reference.

BACKGROUND OF THE INVENTION

1. Field of the Invention

The present invention relates to a method of producing a solar cell; a solar cell, and a method of producing a semiconductor device. In particular, it relates to a method of producing a silicon solar cell which realizes electrical separation of the p n junction necessary for forming the electrodes easily and with a high productivity; a solar cell having the p n junction which is electrically separated in a simple manner, and a method of producing a semiconductor device in which the electrode capable of reducing substantially the contact resistance to the semiconductor substrate by applying the same physical phenomenon as in the electrical separation of the p n junction in forming the electrodes of the solar cell.

2. Discussion of Background

Now, silicon solar cells form the main stream for power solar cells on the earth. In general, process flows in large scale production have to be simple as possible to reduce manufacturing cost.

In the following, description will be made as to an example of a manufacturing process with use of FIG. 17 which shows a diagram of manufacturing steps of a solar cell.

FIG. 17a shows a p type Si substrate 1. In FIG. 17b, phosphorus (P), for instance, is thermally diffused into the p type Si substrate to form an n type diffusion layer 2 by inverting an electric conduction type.

In general, phosphorus oxychloride ($POCl_3$) is often used as a diffusion source of phosphorus. Further, when there is no special contrivance, the n type diffusion layer is formed in the entire surface of the p type Si substrate 1. The sheet resistance of the n type diffusion layer is about several tens $\Omega/\square$ and the depth of the diffusion layer is about 0.3–0.5 $\mu$m.

The n type diffusion layer 2 is applied with a resist on surfaces except for the principal plane (light incident plane), and an etching process is effected so that the n type diffusion layer 2 remains only in the principal plane (FIG. 17c). The resist is removed by using an organic solvent.

Then, screen printing with an aluminum paste 3 is conducted to the surface opposite to that in which the n type diffusion layer is formed, and the substrate is baked in a near-infrared furnace at 700° C.–900° C. for several min to ten and several min. As a result, aluminum as an impurity is diffused from the aluminum paste into the p-type Si substrate 1 whereby a Back Surface Field (BSF) layer 4 as a p+ layer including an impurity at a high concentration is formed as shown in FIG. 17d. The BSF layer 4 contributes the energy conversion efficiency of the solar cell.

Then, a comb-shaped pattern of silver paste is screen-printed to form an n electrode 5 on the n type diffusion layer 2 which is formed only in the principal plane as shown in FIG. 17e. The substrate with the n type diffusion layer 2 and the n electrode 5 is baked at 700° C.–800° C. whereby a solar cell is completed.

Although illustration is omitted for simplifying description, there are many cases that an antireflection film such as $TiO_2$, SiN, $SiO_2$ or the like is formed on the n type diffusion layer 2 in order to improve the energy conversion efficiency.

FIG. 17f shows a structure of a solar cell produced according to the process similar to the above-mentioned process wherein the n type diffusion layer 2 is remained in side surfaces of the p type Si substrate 1 in addition to the principal plane. In this case, a portion indicated by reference numeral 6 has a $P^+$/n junction. The concentration of an impurity (phosphorus) in or near the surface of the n type diffusion layer 2 is very high as the order of $10^{20}$–$10^{21}$ $cm^{-3}$, such a structure being apt to cause electrical leaking. As a result, the energy conversion efficiency of the solar cell is remarkably reduced. Namely, if the n type diffusion layer is not formed only in a single plane (light incident plane) as shown in FIG. 17c, a solar cell having excellent characteristics can not be manufactured. In the conventional technique, as described above, the application of a resist to protect the surface of the diffusion layer, the etching treatment and the removal of the resist are required. In order to reduce the manufacturing cost, however, it is necessary to simplify these processes as possible.

SUMMARY OF THE INVENTION

It is an object of the present invention to provide a method of producing a solar cell which can realize the electrical separation of the p n junction necessary for producing the solar cell in a very simple manner, and which can improve manufacturing cost, and productivity.

Further, it is an object of the present invention to provide a method of producing a semiconductor device which can form electrodes by applying the same physical phenomenon as in the method of electrically separating the p n junction in forming the electrodes of a solar cell to thereby reduce remarkably the contact resistance to the semiconductor substrate.

In accordance with the present invention, there is provided a method of producing a silicon solar cell having a p n junction comprising a silicon layer as a power generation layer and a thin layer of an electrical conductive type opposite to that of the silicon layer which is formed on a front surface, or both a front surface and a rear surface, or the entire surface including the edges of the silicon layer, the method being characterized by comprising a step of effecting an electrical separation of the p n junction by providing on the p n junction a material composed mainly of glass which has a property of melting silicon, followed by baking the material.

The thin layer is from several hundred Å to several micron meters thick, and is formed by thermal diffusion of an impurity, ion implantation, or decomposition of a raw gas by the application of an external energy such as heat or plasma. The material composed mainly of glass is in a paste like form which is suitable for coating and patterning.

Further, the material composed mainly of glass is capable of electrically separating the p n junction and of leaving the p n junction at the position where it has been originally formed, without removing the p n junction.

The above-mentioned method further comprises a step of removing the material composed mainly of glass, which is conducted after the p n junction has been electrically separated by baking the material composed mainly of glass.

The method of producing a solar cell further comprises a step of forming a p electrode and an n electrode necessary for collecting power in the solar cell in a region other than the region of p n junction where the material composed mainly of glass is formed.

The step of forming the p electrode and the n electrode is conducted after the formation of the material composed mainly of glass.

The step of forming the p electrode and the n electrode is conducted before the the formation of the material composed mainly of glass.

Further, as the p electrode and the n electrode, a combination of materials selected from the group consisting of silver, aluminum-silver and aluminum is used.

The p electrode and the n electrode are formed in a front surface or both a front surface and a rear surface where the p n junction is or are provided, and the p electrode and the n electrode are baked at the same time of baking the material composed mainly of glass.

The p electrode and the n electrode are formed in a front surface or both a front surface and a rear surface where the p n junction is or are provided, and the p electrode and the n electrode are baked after the step of baking the material composed mainly of glass.

The step of baking the p electrode and the n electrode is conducted after the material composed mainly of glass, which has been subjected to baking, has been removed.

The p electrode and the n electrode are formed on a front surface or both a front surface and a rear surface where the p n junction is or are provided, and the p electrode and the n electrode are baked before the material composed mainly of glass is baked.

The material composed mainly of glass is provided on the p n junction in a form of pattern by using a screen printing or a roll coater printing.

A material for the p electrode and the n electrode is provided on the p n junction in a form of pattern by using a screen printing or a roll coater printing.

In accordance with the present invention, there is provided a solar cell comprising a p n junction which comprises a substrate and a thin layer of an electrical conductive type opposite to that of the substrate which is formed on a front surface, or both a front surface and a rear surface, or the entire surface including edges of the substrate, and a p type electrode and an n type electrode which are formed on the p n junction, the solar cell being characterized in that a material composed mainly of glass which is capable of electrically separating the p n junction, is provided between the p type electrode and the n type electrode.

In accordance with the present invention, there is provided a method of producing a semiconductor device wherein an insulating film is formed on a front surface or both a front surface and a rear surface of a semiconductor substrate having a junction, the method being characterized by comprising a step of forming an electrode which penetrates the insulating film to electrically contact with the semiconductor substrate by providing on the insulating film a metallic paste material containing glass which has a property of melting the insulating film, followed by baking the material.

The insulating film is constituted by a single layer composed of a silicon nitride film or a plurality of layers wherein at least one layer is a silicon nitride film.

The insulating film of a plurality of layers includes a silicon oxide film in addition to the silicon nitride film.

The silicon nitride film is formed by a thermal CVD method or a plasma CVD method.

The insulating film of a plurality of layers includes at least one titanium oxide film.

The insulating film includes a silicon oxide film in addition to the titanium oxide film.

The titanium oxide film is formed by coating an organic liquid material including titanium on the semiconductor substrate followed by baking, or is formed by a thermal CVD method.

The metallic paste material is baked in an atmosphere of a gas mixture of oxygen and nitrogen where the concentration of oxygen is 30% or more.

The silicon oxide film is formed by a thermal oxidation method, a thermal CVD method or a plasma CVD method.

The glass contains lead, boron, silicon and oxygen as major components.

The metallic paste material comprises at least one member selected from the group consisting of a silver paste, a silver-aluminum paste and an aluminum paste.

The semiconductor substrate is a single crystal silicon substrate or a polycrystal silicon substrate.

The junction in the silicon substrate is formed by using a semiconductor layer of the fourth group of the periodic table which contains as an impurity an element belonging to the third group or the fifth group.

The semiconductor layer containing a fourth group element is a semiconductor layer formed by diffusing an impurity or by ion implantation to a silicon substrate, or a thin semiconductor layer comprising a single element or plural elements which are deposited by decomposition reaction of a raw material gas or a gas mixture in the silicon substrate by means of heat or plasma.

The method of producing a semiconductor device further comprises a step of dipping the semiconductor substrate in an aqueous solution containing hydrofluoric acid or ammonium fluoride after the step of forming the electrode by baking the metallic paste material to allow the penetration of the material through the insulating film to electrically contact with the semiconductor substrate.

The method further comprises a step of conducting a heat treatment in an atmosphere containing hydrogen, before or after the step of dipping the semiconductor substrate in an aqueous solution containing hydrofluoric acid or ammonium fluoride.

For instance, lead-boron glass is added in a silver paste used for the material for electrodes for a silicon solar cell. The glass is in a form of frit and comprises 5–30% of lead (Pb), 5–10% of boron (B), 5–15% of silicon (Si) and 30–60% of oxygen (O), for instance. Further, there is a case that several percents of zinc (Zn) and cadmium (Cd) are mixed.

The lead-boron glass has such characteristics that it is molten by the application of heat of several hundreds ° C. (for instance, about 700° C.) which however depends on composition, and it penetrates silicon at the melting. Such phenomenon is described in detail in publications such as G. C. Cheek et al. (IEEE Transactions on Electron Device, vol. ED31, No. 5, 1984, pp. 602–609) or R. Mertens et al. (Conference Record of the 17th IEEE Photovoltaic Specialists Conference, 1984, pp. 1347–1351).

The electrical contact between the silicon substrate and the silver paste can be obtained by utilizing the characteristics of the glass frit. However, attention should be paid to a quantity of glass frit and a baking temperature so that the glass frit in the silver paste penetrates the n type diffusion layer as shown in FIG. 17 showing a conventional technique, without breaking the junction. A feature of the present invention is to positively utilize the characteristics of the glass frit and electrically separates the p n junction in an easy manner.

BRIEF DESCRIPTION OF DRAWINGS

A more complete appreciation of the invention and many of the attendant advantages thereof will be readily obtained as the same becomes better understood by reference to the following detailed description when considered in connection with the accompanying drawings, wherein:

FIGS. 8(a) to 8(c) are diagrams showing a method of producing a solar cell by using a glass paste in accordance with a sixth embodiment of the present invention;

DETAILED DESCRIPTION OF PREFERRED EMBODIMENTS

Figure 1:
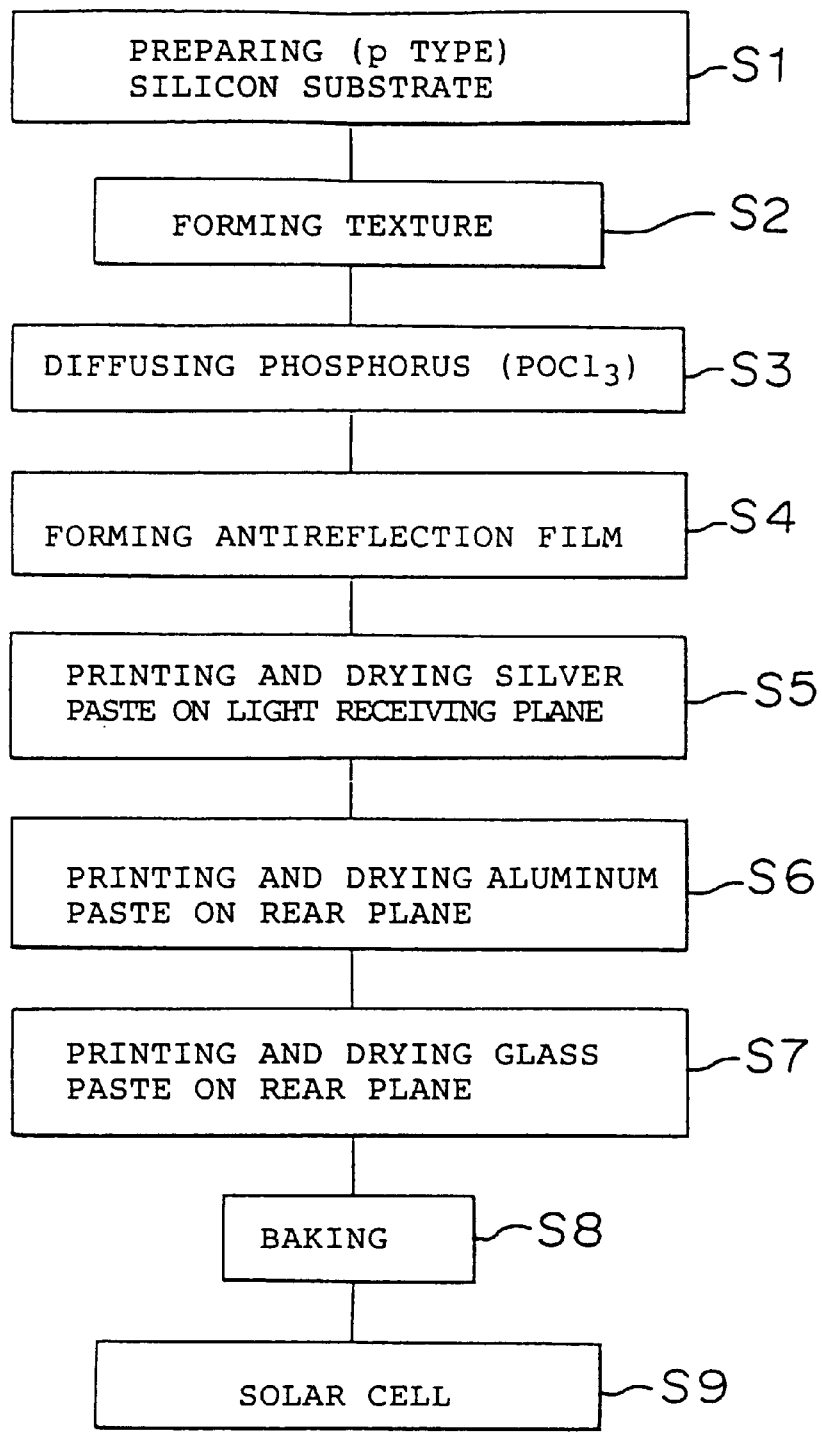
FIG. 1 is a flow chart showing a process on a. method of producing a solar cell by using a glass paste according to an embodiment of the present invention.

Preferred embodiments of the present invention will be described with reference to the drawings wherein the same reference numerals designate the same or corresponding parts.

In the present invention, appropriate amounts of diethyleneglycol monobutylether and ethyleneglycol monobuthylether are mixed with the lead-boron glass having the composition as described above, and the mixture is rendered to be in a paste form (hereinbelow, referred to as glass paste) by adjusting the viscosity so as to be capable of a screen printing.

EMBODIMENT 1

FIG. 1 is a flow chart showing a typical process of producing a solar cell according to the present invention. First, a p type silicon substrate is prepared. The silicon substrate is etched with an aqueous alkali solution such as sodium hydroxide having a concentration of 1–several % to thereby form on the front surface a convex/concave structure called a texture. The texture is to obtain multiplex reflection of light on-the front surface of the solar cell whereby the reflectance is effectively reduced and the conversion efficiency is improved (Steps S1, S2). However, the present invention is also applicable to a case without forming the texture.

Then, $POCl_3$ is used to form an n type diffusion layer due to thermal diffusion of phosphorus (Step S3), and an antireflection film is formed on the outer surface of the n type diffusion layer (Step S4). Then, a step of printing a silver paste electrode on a light receiving plane followed by drying (Step S5), a step of printing an aluminum paste electrode on a rear surface followed by drying (Step S6), a step of printing a glass paste on the rear plane followed by drying (Step S7), and a step of baking are successively conducted whereby a solar cell is completed (Steps S8, S9). However, the present invention is applicable even to a case that there is no antireflection film on the light receiving plane. Further, no problem will rise even when the order of forming by printing a front electrode and a rear electrode is exchanged.

Description will be made as to the preparation of the solar cell according to the above-mentioned process flow with reference to FIGS. 2(a), 2(b-1), 2(b-2), 2(c) and 2(d).

FIG. 2a is an illustration which shows that silicon can be penetrated by the glass paste. FIG. 2(a) was obtained by measuring with a surface roughness gauge a quantity of penetration of silicon in the silicon substrate produced as follows. A p type single crystal silicon substrate is used. A line-shaped pattern of glass paste having a width of 400 $\mu$m is formed on a surface of the silicon substrate by using a screen printing method. The silicon substrate is dried at 100° C. in dry air for 10 min. Then, the silicon substrate is baked at 650° C. in dry air for several minutes. Evaluation of a quantity of penetration is conducted after the baked glass paste has been removed by etching with hydrofluoric acid.

Since the removing ability of the glass paste by etching is slightly poor, the glass paste can easily be removed by the application of an external force such as ultrasonic waves.

FIG. 2a shows that the silicon is penetrated by about 0.5 µm. As described below, $POCl_3$ is used as a raw material. And when the depth of the diffusion layer as a result of thermal diffusion of phosphorus is determined to be 0.3 µm, the diffusion layer can sufficiently be penetrated and removed. The depth of the junction can be controlled with good reproducibility by adjusting temperature and time for diffusion.

Figure 2:
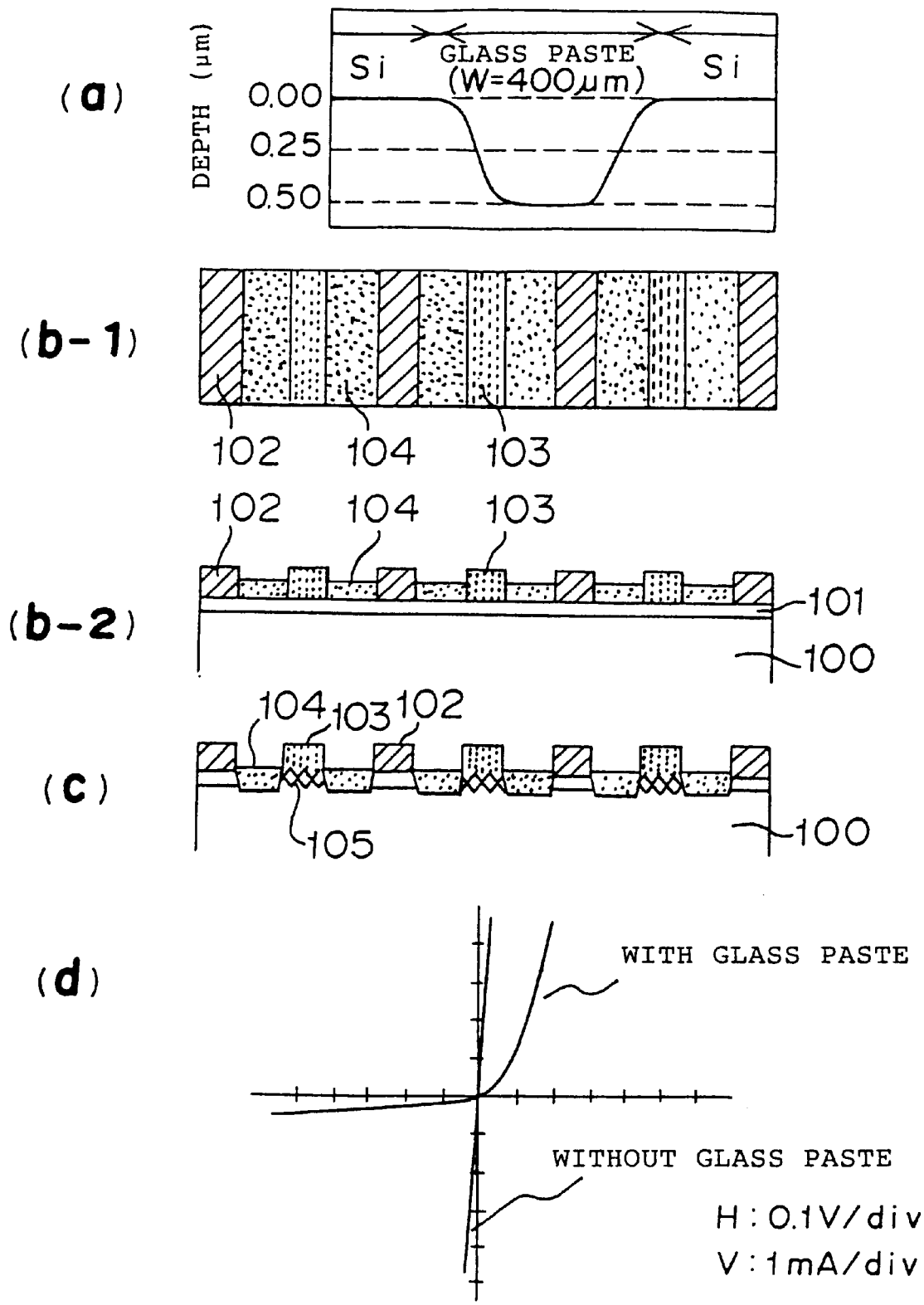
FIGS. 2(a), (b-1), (b-2), (c) and (d) are diagrams for explaining a method of electrically separating the p n junction of a solar cell by using a glass paste according to the present invention.

FIGS. 2b-1 and 2b-2 are respectively a plane view and a cross-sectional view partly omitted of a sample for which evaluation was made as to whether or not the electrical separation of the p n junction is in fact possible by this method.

In FIGS. 2b-1, 2b-2, reference numeral 100 designates a p type silicon substrate having a resistivity of about 2 Ωcm, numeral 101 designates an n type diffusion layer in which phosphorus in $POCl_3$ are thermally diffused, which was confirmed to have a thickness of about 0.3 µm through evaluation of SIMS (Secondary Ion Mass Spectroscopy), numeral 102 designates an n electrode formed of a silver paste, numeral 103 designates a p electrode formed of an aluminum-silver paste including several percents of aluminum, and numeral 104 designates a glass paste. In this embodiment, the aluminum-silver paste is used for the p electrode 103. However, it has been confirmed that the same effect as described below is obtainable even in a case of using an aluminum paste without including silver.

FIG. 2d shows the current (ordinate)—voltage (abscissa) characteristics between the n electrode 102 of a silver paste and the p electrode 103 of an aluminum-silver paste, which are baked at 700° C. for several minutes, of the sample shown in FIG. 2b-2 (which is represented as "with glass paste" in the Figure) and current-voltage characteristics between the n electrode 102 of a silver paste which is formed without a glass paste pattern and the p electrode 103 of an aluminum-silver paste which is subjected to patterning (which is represented as "without glass paste"). As is clear from the diagram, the existence of the glass paste 104 provides clearly the performance of a diode (rectification), and it is understood that the method of the present invention is very effective for electrical separation of the p n junction. The glass paste 104 after baking is an insulating material, and accordingly, the performance as the diode as shown in FIG. 2d does not change even when the glass paste 104 is removed.

Returning to FIG. 2c, when the sample shown in FIG. 2b-2 is baked, the sample assumes the shape as shown in FIG. 2c wherein the glass paste 104 penetrates the n type diffusion layer 101; aluminum is diffused into the n type diffusion layer 101 under the p electrode 103 of an aluminum-silver paste, and a p type inversion layer 105 obtained by inverting the n type diffusion layer into a p type, is formed.

In this embodiment, the n type diffusion layer 101 is obtained by thermally diffusing phosphorus of $POCl_3$. However, the same effect can be obtained by using the n type diffusion layer formed by other methods such as ion implantation of phosphorus or arsenic, or decomposition of a gas mixture comprising a silane type gas such as monosilane ($SiH_4$), disilane ($Si_2H_6$), dichlorosilane ($SiCl_2H_2$), trichlorosilane ($SiCl_3H$), tetrachlorosilane ($SiCl_4$) and phosphine ($PH_3$) as an impurity material with an external energy such as heat or plasma.

Further, silicon carbide (SiC) obtained by a gas mixture of monosilane and methane or ethane may be used in order to control the surface recombination at the surface of the solar cell, the window effect or the like by changing the p n junction to a hetero junction form. Further, it is possible for the thin layer formed by these methods to have a form of amorphous, microcrystal, polycrystal, or monocrystal by changing conditions of forming such as temperature. Further, when the thickness of the thin layer is determined to be from several hundreds Å to several micron meters, the same effect can be obtained by contriving the composition of the glass paste and the condition of baking.

In this embodiment, patterning is first conducted to the metallic paste for electrodes and the glass paste and then, baking is conducted as in FIG. 2b-2, as an example of realizing the electrical separation of the p n junction. However, it is possible to electrically separate the p n junction by another method. For instance, the electrodes are formed after the patterning and the baking of the glass paste, or the electrodes are formed after the patterning, the baking and the removing by etching of the glass paste, or the glass paste is patterned and baked after the electrodes are patterned and baked. Further, as a specific condition of temperature of baking, it was confirmed that the same effect of separation of the p n junction could be obtained by baking at 600–950° C. for from several min to several tens min.

Figure 3:
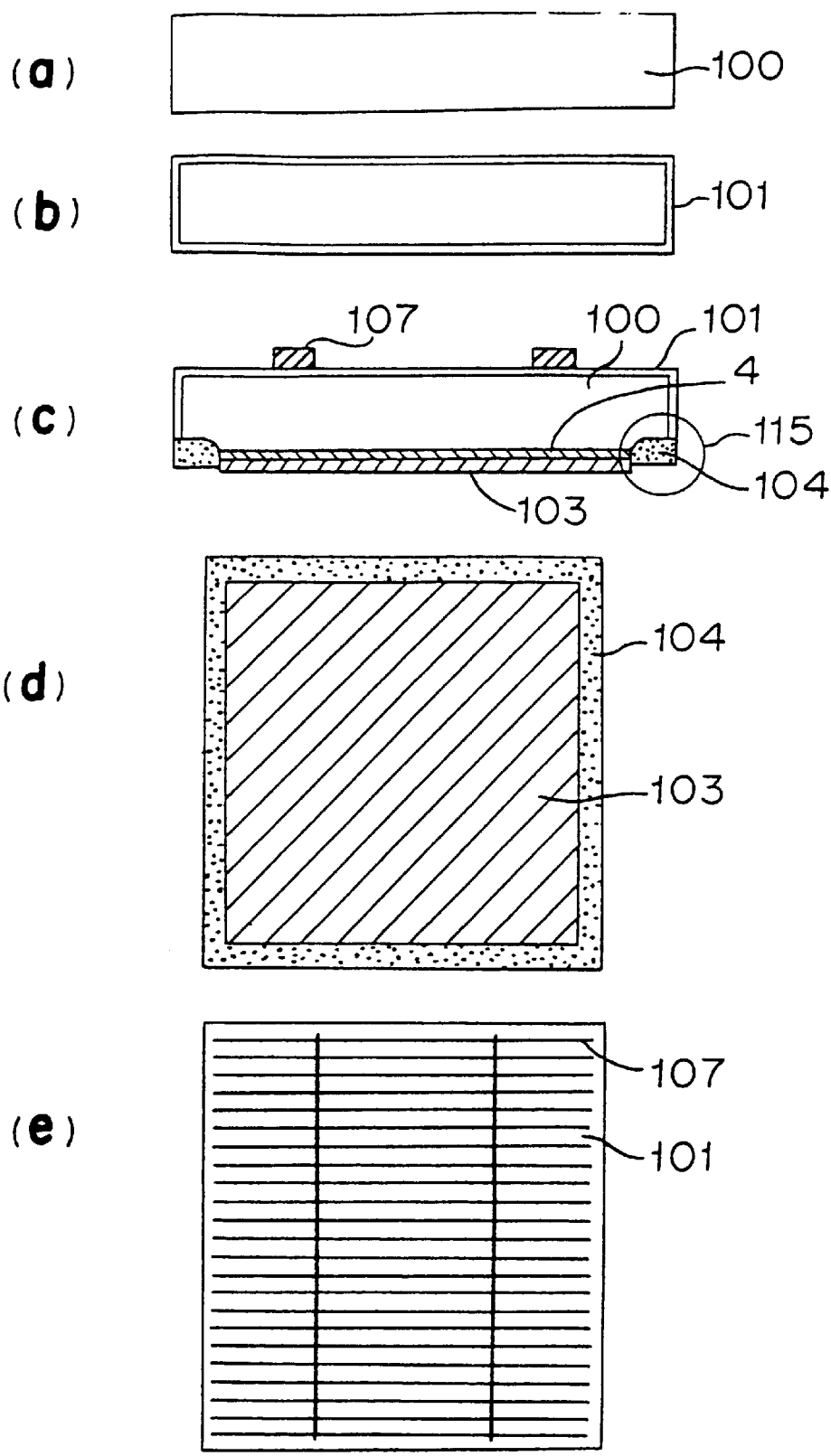
FIGS. 3(a) to 3(e) are diagrams showing the method of producing the solar cell by using a glass paste in accordance with the first embodiment of the present invention.

FIG. 3 shows diagrams for actually producing a solar cell based on the above-mentioned basic experiment, which corresponds to the flow chart shown in FIG. 1.

Figure 17:
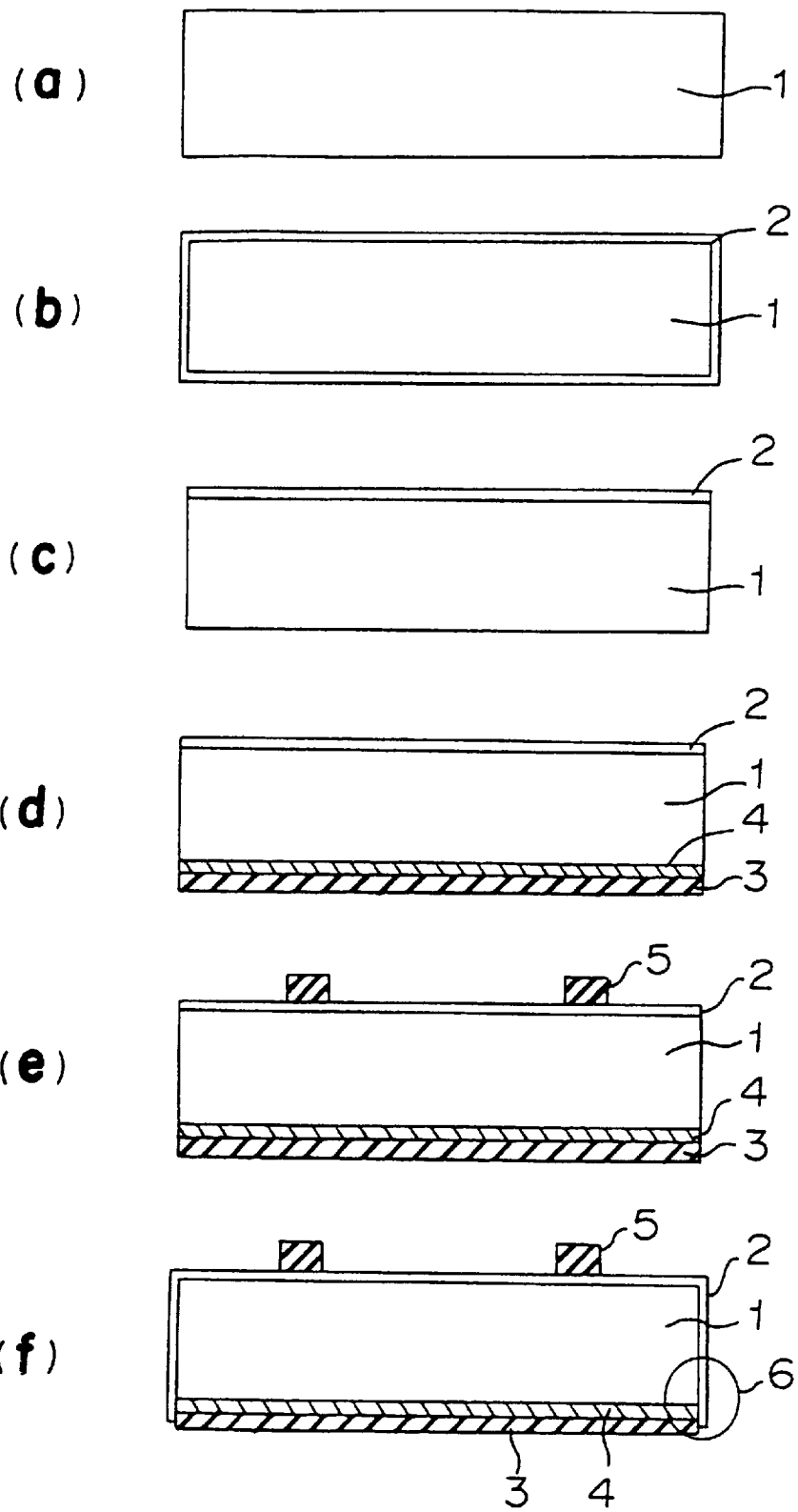
FIGS. 17(a) to 17(f) are diagrams for explaining a conventional method of producing a solar cell.

The structure of the solar cell shown in FIG. 3(e) is substantially the same as that shown in FIG. 17 for explained the conventional technique. In FIG. 3a, a p type silicon substrate 100 having a thickness of 600 µm, a size of 10 cm×10 cm, a specific resistance of 2 Ωcm and a plane direction of (100) was used. The n type diffusion layer 101 shown in FIG. 3b was formed by thermally diffusing phosphorus with use of $POCl_3$. The diffusion was conducted at 860° C. for 10 min to form the diffusion layer of a sheet resistance of about 50 Ω/□ and a depth of junction of 0.3 µm.

The feature of this embodiment resides in forming the glass paste 104 at the location as shown in FIG. 3c and FIG. 3d wherein the width of the patterned glass paste 104 was 0.5 mm–2 mm. The shape of the n electrode 107 of a silver paste to be formed on the light receiving plane (light incident plane) was in a comb-like pattern (the pitch of electrode: 2.5 mm) as shown in FIG. 3e. The n electrode 107 and the glass paste 104 were formed by baking them in dry air at 700° C. for 7 min.

The characteristics of the solar cell produced by this method were comparable with those obtained by the conventional method. This is because of the glass paste 104 which electrically separates the BSF layer 4 from the n type diffusion layer 101 as indicated in an edge portion 115 in FIG. 3c. Further, it is possible to produce a solar cell in the same manner as shown in the flow chart of FIG. 1, namely, the antireflection film is formed on the front surface of the n type diffusion layer 2, and then, the n electrode 107 of a silver paste is formed on the light receiving plane, the p electrode 103 of an aluminum paste is formed on the rear plane as well as the glass paste 104, although such process is not shown in FIGS. 3a–e.

In this case, a glass component contained in the silver paste for the n electrode 107 penetrates (firethrough) the antireflection film at the time of baking whereby the n electrode 107 is electrically contact with the n type diffusion layer 101. The antireflection film may be a silicon nitride film (SiNx), a titanium oxide film (TiOx), a silicon oxide film (SiOx) or the like formed by using, for instance, a CVD method, a sputtering method or the like wherein the thickness of the film is between several hundred Å to 1000 Å.

The method of present invention allows the application of the above-mentioned process after the concave/convex structure called a texture (description of Embodiment 6 is referred) is provided in a surface of the substrate as shown in the flow chart of FIG. 1, although the formation of the texture is not shown in FIGS. 3a–e.

When the antireflection layer is formed, specifically, the silicon nitride film is formed by a vacuum CVD method, the silicon nitride film is also formed at the rear plane of substrate. In the present invention, however, it was confirmed that a solar cell could be produced by using the above-mentioned flow of producing without removing the silicon nitride film formed in the rear plane. It is because the glass component contained in the glass paste 104 formed in the rear plane and the silver paste for the n electrode 107 penetrates (firethrough) the silicon nitride film at the rear plane side whereby electrical separation of the p n junction and the contact of the electrode with the semiconductor substrate can be realized. Such effect is applicable to another kind of antireflection film other than the silicon nitride film.

As described above, in accordance with this embodiment, the step of removing by etching the needless diffusion layer formed in the rear surface of the substrate, which is required in the conventional technique, becomes unnecessary, and accordingly, manufacturing process can remarkably be simplified.

Of course, various different steps can be selected with respect to the process flow for forming the glass paste 104 and the paste for electrodes. Further, in this embodiment, even when the electric conductive type of the substrate is opposite, the present invention is applicable in the same thinking as in Embodiment 4 described later.

In this embodiment, the patterns for the electrodes and the glass paste may be formed by a roll coater printing method instead of the screen printing method.

The processes described above can be applied to realize several embodiments described below, and can be modified and/or selected depending on structures of solar cells and a state of silicon crystal.

EMBODIMENT 2

FIGS. 4a to 4f depict the steps in a manufacturing process of a solar cell and a structure of solar cell with respect to Embodiment 2 of the present invention. The manufacturing process will be described with reference to FIGS. 4a to 4f.

Figure 4:
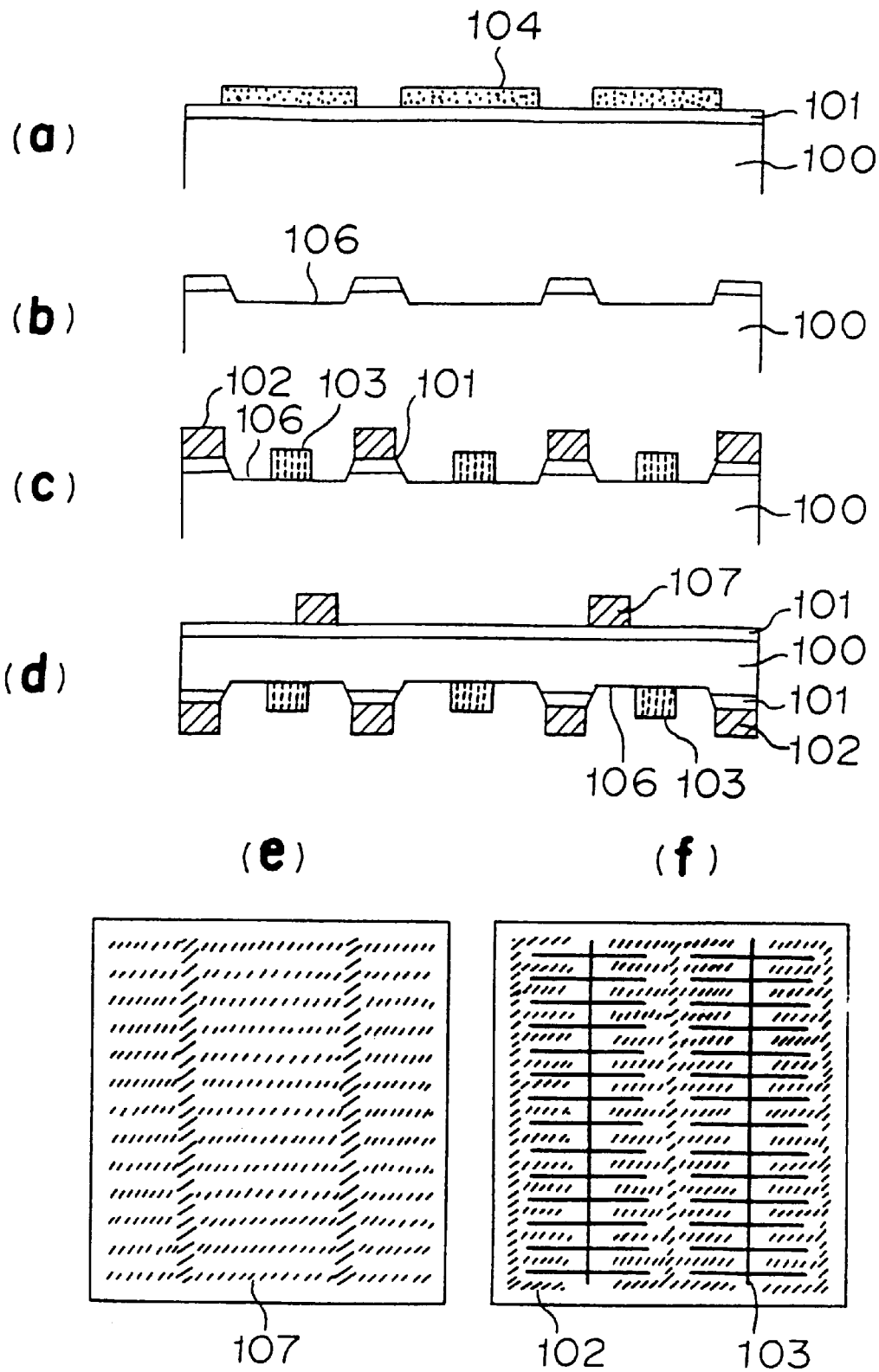
FIGS. 4(a) to 4(f) are diagrams showing a method of producing a solar cell by using a glass paste according to a second embodiment of the present invention.

FIG. 4a shows a state that a pattern of a glass paste 104 is formed on a p type silicon substrate 100 in which an n type diffusion layer 101 is formed in the same manner as Embodiment 1. FIG. 4b shows a state that the glass paste 104 is removed by etching after a sample shown in FIG. 4a has been baked. The n type diffusion layer 101 is removed in accordance with the mechanism described with respect to Embodiment 1, and a surface of a p type silicon substrate 106 is exposed as shown in FIG. 4b.

FIG. 4c shows that an n electrode 102 of a silver paste is formed on the n type diffusion layer 101 which is not subjected to the patterning of the glass paste 104 and a p electrode 103 of an aluminum-silver paste is formed on the surface of the p type silicon substrate 106. The pitch of the patterned electrodes is in a range of from about 1 to about 3 mm.

FIG. 4d shows that an electrode is formed on the n type diffusion layer 101 in the opposite plane (which constitutes the main light incident plane (light receiving plane) when the solar cell functions) with respect to the plane to which the processes as shown in FIGS. 4a to 4c are carried out. In FIG. 4d, reference numeral 107 designates an n electrode of silver paste formed on the main light incident plane (light receiving plane). The pitch of the patterned n electrode is in a range of from about 2 mm to about 3 mm.

The electrodes 102, 103 and 107 may be baked separately. However, the electrodes 102, 103 and 107 can be baked simultaneously after they have been printed in a continuous manner so that the manufacturing process can be simplified. The n type diffusion layer 101 to be formed on the main light incident plane can be formed by various ways as described with respect to Embodiment 1. The order of formation can be changed, specifically, the n type diffusion layer 101 to be formed on the main light incident plane may be formed simultaneously or after the formation of the n type diffusion layer 101 to be formed on the rear plane.

FIGS. 4e and 4f show models of electrode pattern for the solar cell. The solar cell shown in FIGS. 4e and 4f has such structure that the n electrode 107 is provided on the main light incident plane and the n electrode 102 and the p electrode 103 are provided on the rear plane (opposite plane), which is known as one of effective structures to improve the conversion efficiency of the solar cell (vide, T. Warabisako and K. Matsukuma, Technical Digest of the 7th International Photovoltaic Science and Engineering Conference, Nagoya, Japan, 1993, pp. 57). However, the present invention can realize the solar cell having such structure by a simplified process.

EMBODIMENT 3

FIGS. 5a–d are diagram for explaining a manufacturing method of Embodiment 3 to realize the structure of the solar cell of Embodiment 2.

In Embodiment 2, description has been made as to the method of removing the glass paste 104 in order to electrically separate the p n junction. However, as already described with respect to Embodiment 1, it is not always necessary to remove the glass paste 104. In this embodiment, description will be made as to a case of manufacturing process of solar cell in which the glass paste 104 is not removed.

Figure 5:
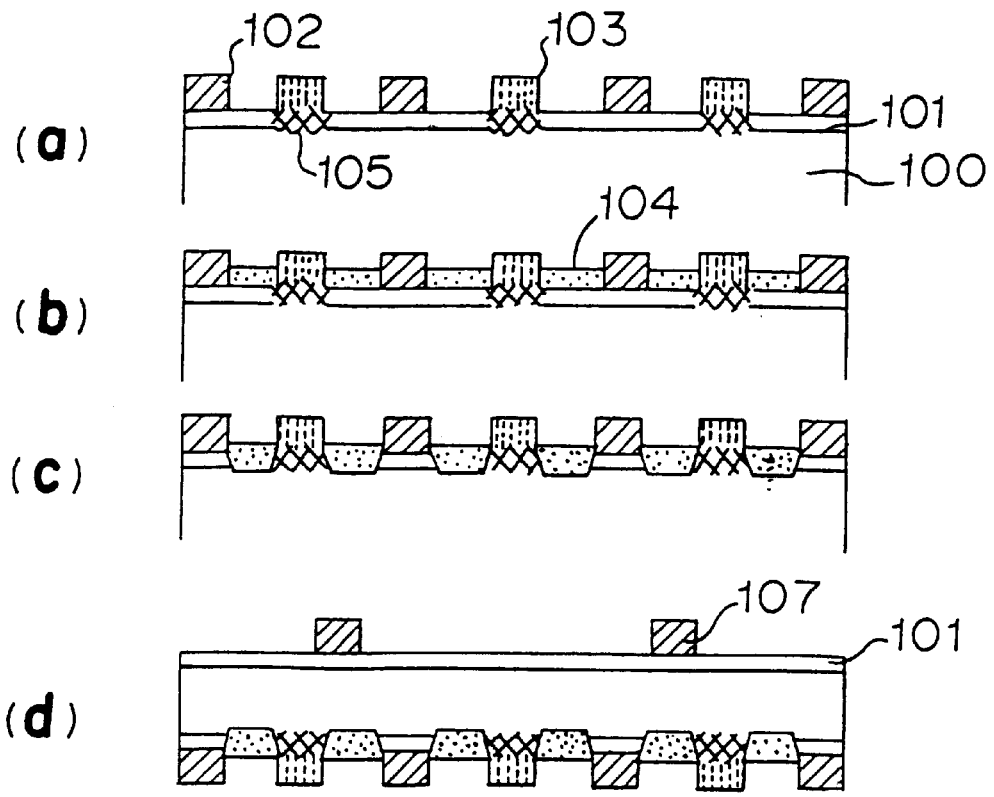
FIGS. 5(a) to 5(d) are diagrams showing a method of producing a solar cell by using a glass paste in accordance with a third embodiment of the present invention.

FIG. 5a shows a state that a silver paste pattern for an n electrode 102 and an aluminum-silver paste pattern for a p electrode 103 are formed by printing on the p type silicon substrate 100 in which the n type diffusion layer 101 is formed in the same manner as Embodiment 1, and the substrate 100 with the patterns is baked, wherein reference numeral 105 designates a p type inversion layer which is the same as already described.

FIG. 5b shows a state that a glass paste 104 is printed in order to effect the electrical separation of the n electrode 102 from the p electrode 103; FIG. 5c shows a state that the substrate with the glass paste 104 is baked to complete the electrical separation of the p n junction, and FIG. 5d shows a state that a pattern for an n electrode 107 of silver paste is formed on the main light incident plane. In this embodiment, the baking process to the electrodes 102, 103 and 107 and the glass paste 104 are conducted separately. However, the baking step may be conducted simultaneously after the electrodes 102, 103 and 107 have been formed by printing so that the manufacturing process can be simplified.

According to this embodiment, it is possible to produce the solar cell with further simplified process than that of Embodiment 2.

EMBODIMENT 4

Figure 6:
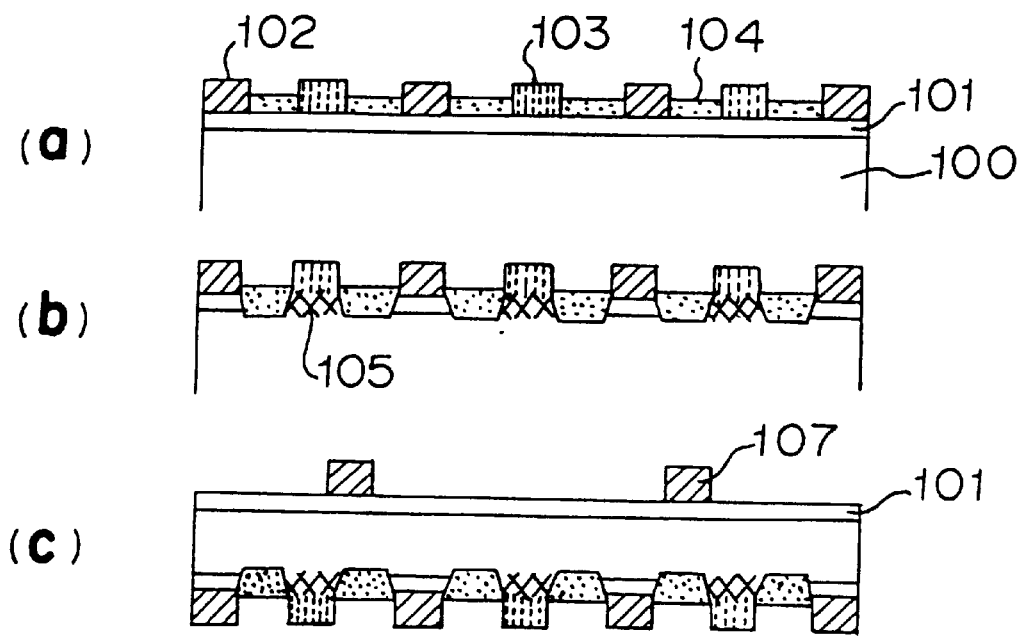
FIGS. 6(a) to 6(c) are diagrams showing a method of producing a solar cell by using a glass paste in accordance with a fourth embodiment of the present invention.

FIGS. 6a–c are a diagram illustrating the method of producing the solar cell according to Embodiment 4 in order to realize the structure of the solar cell of Embodiment 2.

In Embodiment 3 described above, the patterns for the p electrode, the n electrode and the glass paste are separately formed as shown in FIGS. 4a and 4b. However, the following method is effective in order to simplify the manufacturing process.

FIG. 6a shows a state that a pattern of an n electrode 102 of a silver paste, a pattern of a p electrode 103 of an aluminum-silver paste and a pattern of a glass paste 104 are printed on the p type silicon substrate 100 in which the n type diffusion layer 101 is formed.

FIG. 6b shows a state that these patterns are baked at once. Numeral 105 designates a p type inversion layer which is the same as already described.

FIG. 6c shows a state that a pattern of an n electrode 107 of a silver paste is formed on the main light incident plane. In this embodiment, the baking of the patterns for the electrodes 102, 103 and the glass paste 104 is conducted separately from the baking of the patterns for the electrode 107. However, in order to simplify the manufacturing process, the patterns for the electrodes 102, 103 and 107 and the glass paste 104 are first printed and then, they are simultaneously baked.

In accordance with Embodiment 4, it is possible to produce the solar cell with a further simplified process than that Embodiment 3.

In the above Embodiments 1 to 4, optimum conditions are not described. Selection of the processes for producing actual solar cells, i.e., selection of materials for electrodes, the order of printing of the glass paste, temperature and the number of turns of baking, the order of baking and so on largely depends on the quality of silicon crystal used. Accordingly, the optimum conditions can not easily be determined, and it should be determined in consideration of a thermal condition and so on. Anyway, it is clear that the present invention provides a simplified process for producing solar cells.

EMBODIMENT 5

Figure 7:
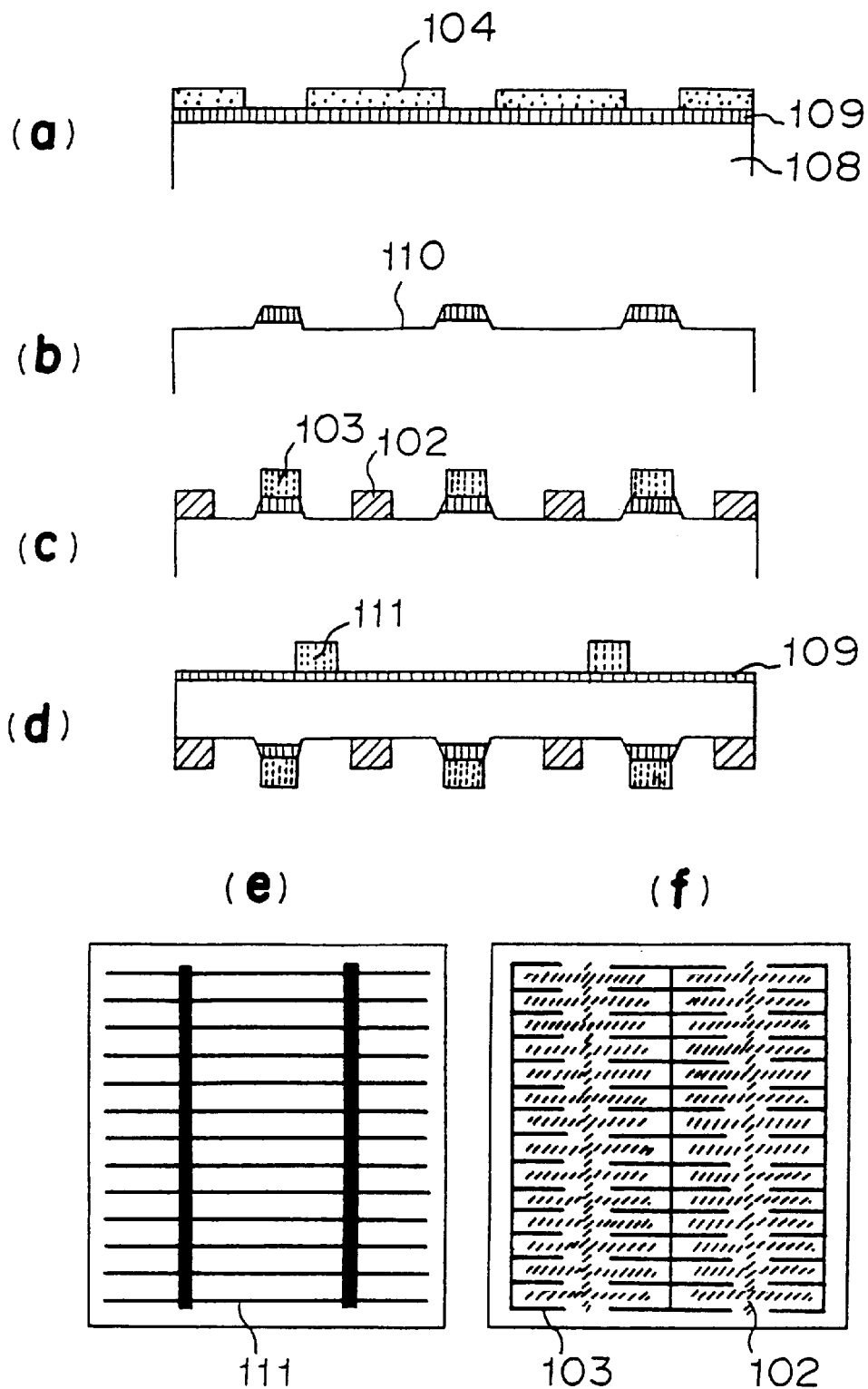
FIGS. 7(a) to 7(f) are diagrams showing a method of producing a solar cell by using a glass paste in accordance with a fifth embodiment of the present invention.

FIG. 7 is a diagram for explaining a method of producing a solar cell according to Embodiment 5 of the present invention.

Description of Embodiments 1 to 4 concerns use of a substrate having an electric contactive type of p. However, this embodiment allows to use a substrate having an n type.

In FIG. 7a, reference numeral 108 designates an n type silicon substrate having a resistivity of about 2 Ωcm and numeral 109 designates a p type diffusion layer formed by thermally diffusing boron. The p type diffusion layer 109 may be a p type silicon layer which is formed by ion implantation of an impurity such as boron or by decomposing a gas mixture of a silane type gas and diborane gas ($B_2H_6$) by applying an external energy such as heat or plasma. When the diffusion layer 109 is from several hundred Å to several micron meters thick, it is possible to provide the effect as described below in the same reason as described with respect to Embodiment 1.

First, on the p type silicon layer 109, a glass paste 109 is formed in a pattern by a screen printing. The shape of the pattern and the pitch may be the same as described in Embodiment 2.

FIG. 7b shows a state that the glass paste 104 which has been subjected to the baking step is removed by etching with hydrofluoric acid. Due to the nature of the glass paste 104, etching effected is obtainable regardless of the electric conductive type of the silicon layer to be treated to be either n or p, with the result that the shape as shown in FIG. 7b is obtainable. Reference 110 designates an n type silicon substrate surface exposed as a result of penetration by the glass paste 104.

FIG. 7c shows a state that a silver paste pattern for an n type electrode 102 is formed by printing on the n type silicon substrate surface 110 and an aluminum-silver paste pattern for a p electrode 103 is formed by printing on the p type diffusion layer 109 which partly remains, and these patterns are baked.

FIG. 7d shows a state that an aluminum-silver paste for a p electrode 111 is formed on the p type diffusion layer 109 which is formed in the opposite plane (which constitutes the main light incident plane (light receiving plane) when the solar cell operates) with respect to the plane to which the processes as shown in FIGS. 7a to 7c are conducted.

The baking of the electrodes 102, 103 and 111 may be conducted separately. However, they may be baked simultaneously in order to simplify the manufacturing process. Various methods as described above may be utilized to form the p type diffusion layer 109 in the main light incident plane. Further, the formation of the p type diffusion layer 109 may be conducted simultaneously or after the formation of the p type layer to be formed in the rear plane.

FIGS. 7e and 7f show models of electrode patterns of the solar cell completed according to the above-mentioned process. Further, an aluminum paste without containing silver may be used instead of the aluminum-silver paste to form the p electrode 111.

EMBODIMENT 6

FIGS. 8a and 8b are respectively a cross-sectional view and a perspective view partly omitted which show a construction of solar cell according to Embodiment 6 of the present invention.

The structure shown in FIG. 8 is different from those of Embodiments 2 to 5. The feature of this embodiment is to use a p type silicon substrate 112 in which viaholes 113 are provided. The n type diffusion layer 101 is extended to the side plane (inner wall) of the viaholes 113 whereby an electric current generated therethrough is collected by means of the n electrode 102 and the p electrode 103 disposed at the rear plane of the solar cell.

The reason of using such structure is as follows. When the p type silicon substrate 112 which contributes generation of power is made thin, reduction of an electric current to be produced can not be avoided. Accordingly, all the electrodes are disposed on the rear plane to thereby increase the surface area for receiving light, with the result of increasing a photocurrrent.

The basic process to realize the above-mentioned structure is disclosed by, for instance, M. Deguchi et al. (Conference Record of IEEE First World Conference on Photovoltaic Energy Conversion, Hawaii, vol. II, pp. 1287 (1994)). Accordingly, the detailed description of the processes is omitted.

FIGS. 8a, 8b and 8c show a completed form of the solar cell produced by such process.

FIG. 8a shows a state that after the n type diffusion layer 101 has been formed in the entire plane of the p type silicon substrate 112, the formation of the electrodes and the electrical separation of the p n junction are conducted by the same process as described with respect to Embodiments 2 and 3 or Embodiment 4 . Here, the n type diffusion layer 101 can be formed by using various ways as described in Embodiment 1.

FIG. 8c is a plane view showing how the electrodes are arranged. In using the patterns of electrodes as illustrated in FIG. 8c in which the p n junction is electrically separated, the embodiment of the present invention is applicable to a solar cell having a p type silicon substrate 112 with viaholes 113.

In FIGS. 8a and 8b, numeral 114 designates a concave/convex structure formed in the front surface, which is generally called a texture. When a silicon substrate having a plane direction of (100) is used, the texture can be formed by etching silicon with use of an aqueous alkali solution such as sodium hydroxide of a concentration of 1–several %. The provision of the texture causes multiple reflection of light at the surface of the solar cell to thereby effectively reduce the reflectivity and improve the conversion efficiency.

In Embodiments 1 to 5, description has been made as to a case without having the texture in order to simplify explanation. However, the texture can be applied to Embodiments 1 to 5 without any problem.

Further, Embodiments 2 to 6 concerns such a structure that an antireflection film is not formed at the light receiving plane side in order to simplify explanation. However, Embodiments 2 to 6 can be applied without any problem to the case of providing an antireflection film in the same manner as described with respect to Embodiment 1.

EMBODIMENT 7

The above-mentioned Embodiments 1 to 6 concern methods for realizing easily electrical separation of the p n junction in the formation of electrodes in solar cells. In this embodiment, description will be made in detail as to a method of producing a semiconductor device which is capable of reducing drastically the contact resistance to the semiconductor substrate by applying the same physical phenomenon as in the method of electrically separating the p n junction in forming electrodes in the solar cell in Embodiments 1 to 6.

In Embodiment 7 and other embodiments which will be successively described, there are described methods of producing a semiconductor device such as a silicon semiconductor device, in particular, a construction body comprising a silicon substrate having a surface on which a silicon nitride film or a titanium oxide film is formed wherein the formation of electrodes of a metallic paste material is simplified to increase productivity and to reduce the contact resistance between the electrodes of metallic paste material and the silicon substrate.

Such methods of producing a semiconductor device is applicable to various kinds of semiconductor devices. In particular, the methods are effective to a photodiode or a light receiving element for a solar cell. Here, a solar cell is exemplified, and the background of the invention is explained. Nowadays, the main stream of producing solar cells for power generation is to silicon solar cells. A process flow for producing the silicon solar cells in a large scale production should be simplified as possible to reduce manufacturing cost. In particular, there is employed a method of forming a metallic paste by a screen printing in order to form electrodes.

In the generally employed process flow for producing a solar cell, steps until the formation of the antireflection film is the same as the steps shown in FIGS. 17a to 17d, and then, the antireflection film is formed on the front surface of the n type diffusion layer 2.

Figure 9:
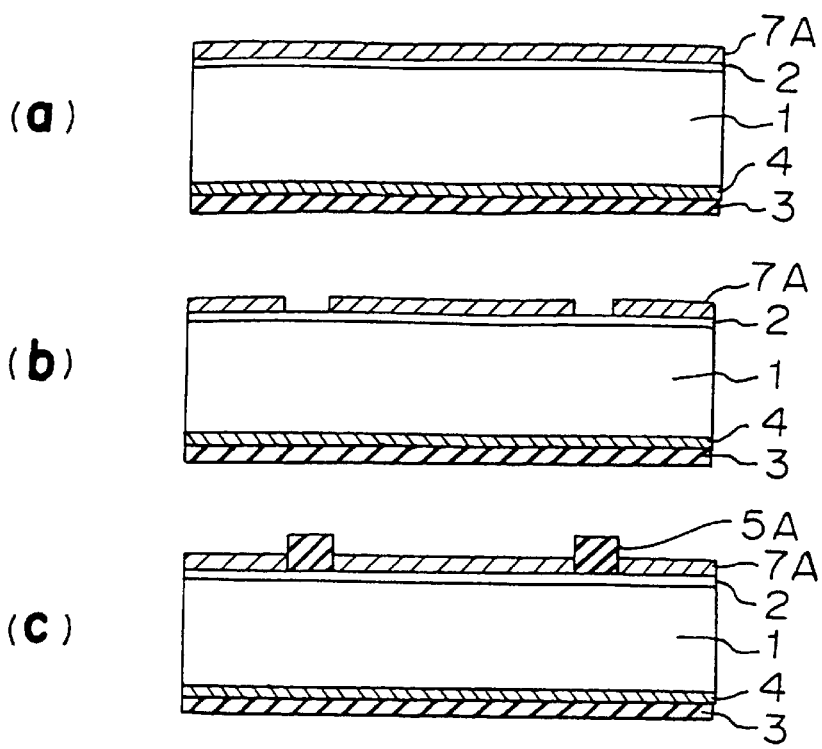
FIGS. 9(a) to 9(c) are diagrams which is for explaining a method of producing a semiconductor device according to a seventh embodiment of the present invention and which shows a flow of producing a conventional solar cell in which a silicon nitride film is used as an antireflection film.
Figure 10:
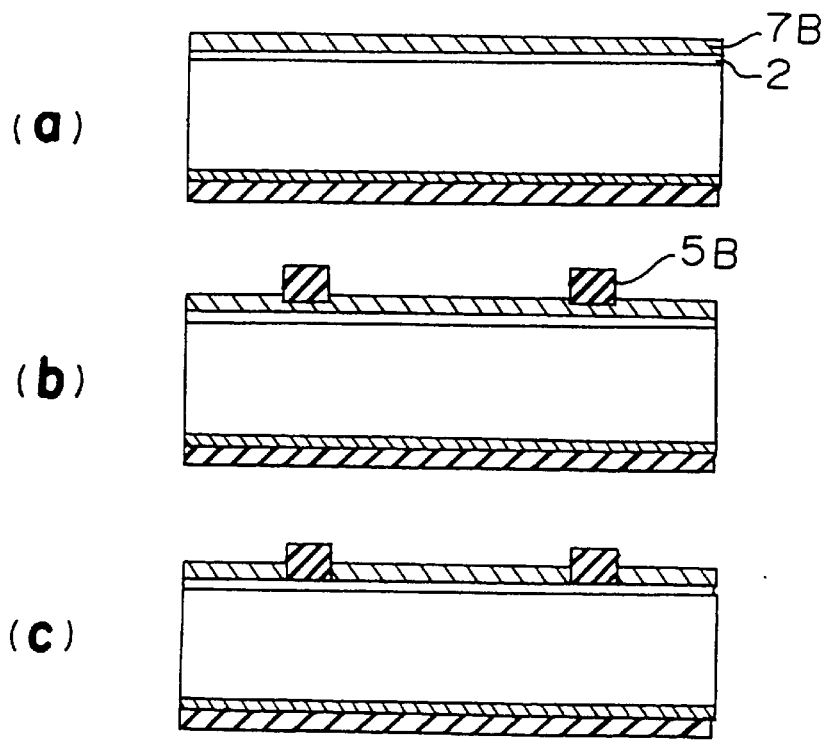
FIGS. 10(a) to 10(c) are for explaining the method of producing the semiconductor device according to the seventh embodiment of the present invention and which shows a flow of producing a conventional solar cell in which a titanium oxide film is used as an antireflection film.

FIGS. 9 and 10 show flow charts showing how to form surface electrodes after the formation of the antireflection film.

FIG. 9 shows a method disclosed, for example, in Japanese Examined Patent Publication Number B5-72114, and FIG. 10 shows a method disclosed, for instance, in Japanese Examined Patent Publication Number B3-46985.

FIG. 9 concerns a method of forming an electrode on a antireflection film 7A made of a silicon nitride film which is formed by using a plasma CVD method, after the process as shown in FIGS. 17a to 17d has been conducted. In this case, the antireflection film 7A made of the silicon nitride film is selectively removed by etching at only a portion where a surface electrode is formed (FIG. 9a→FIG. 9b). Accordingly, there appears the n type diffusion layer at the portion where the silicon nitride film as an insulating member is removed, and a silver paste electrode 5A is directly printed to that portion. Then, the silicon substrate with antireflection film and the silver paste electrode 5A is dried and baked whereby the formation of the surface electrode is completed (FIG. 9c).

FIG. 10 concerns a method of forming an electrode on an antireflection film 7B made of a titanium oxide film which is formed by using a CVD method, after the process shown in FIGS. 17a to 17d has been conducted. In this case, which is different from FIG. 9, a silver paste electrode 5B as a surface electrode is directly printed on the titanium oxide film, followed by drying and baking (FIG. 10a→FIG. 10b). By such process, the antireflection film 7B of titanium oxide film is molten so that the silver paste electrode 5B is brought to contact with the n type diffusion layer with the result of obtaining electrical contact (FIG. 10c).

The above-mentioned technique has been known as a firethrough technique. As described in the publications, the phenomenon of firethrough is apt to occur in the titanium oxide film or the silicon oxide film. In the solar cell of p n junction type as shown in FIGS. 17a to 17d, when a silver paste electrode 5 is formed on a thin n type diffusion layer and if the silver paste electrode 5 is baked at an excessively higher temperature, there is a danger of causing breakage of the p n junction. In order to overcome this problem, there is proposed a method of avoiding the breakage of the n type diffusion layer by incorporating an element of the fifth group of the periodic table to the silver paste and by diffusing the fifth group element into the n type diffusion layer during baking.

For instance, Japanese Examined Patent Publication Number B4-67347 discloses mixing of phosphorus, arsenic, antimony or the like. Further, Japanese Examined Patent Publication Number B3-46985 which is related to FIG. 10 discloses that an element of the fifth group of the periodic table, e.g. phosphorus reacts with the antireflection film of a titanium oxide film or a silicon oxide film to thereby accelerate the firethrough.

As described above, there have been various proposals on the method of forming electrodes in the silicon solar cell. However, the firethrough has not been succeeded in solar cells wherein a silicon nitride film is used as the antireflection film, and the process as shown in FIG. 9 has been required. Or, there is a proposal to use a method of mixing an element of the fifth group of the periodic table such as phosphorus in the silver paste electrode to accelerate the firethrough as shown in FIG. 10. However, the published technique does not disclose a possibility of forming electrodes by using the technique of firethrough to the silicon nitride film.

This Embodiment 7 is to provide a method of producing a semiconductor device which can realize the firethrough even in a case that a silicon nitride film is used as the antireflection film which was difficult in the conventional technique and to reduce drastically the contact resistance to the semiconductor substrate. Further, there is provided a method of producing a semiconductor device which improves the performance of the solar cell and which reduces remarkably the contact resistance even in a case of forming the electrode by utilizing the firethrough technique to a titanium oxide film.

In Embodiment 7, a metallic paste material used has a nature of melting and penetrating an insulating film formed on the semiconductor substrate. In order to realize this, the composition of frit-like glass which is incorporated into the metallic paste material is important. According to experiments by the inventors of this application, it has been revealed that a sufficient effect, which will be described hereinbelow, can be achieved by formulating a glass composition comprising, for instance, 5–30% of lead (Pb), 5–10% of boron (B), 5–15% of silicon (Si) and 30–60% of oxygen (O). Further, in this embodiment, appropriate amounts of diethyleneglycol monobutylether and ethyleneglycol monobutylether were mixed with the glass having the above-mentioned composition, and the mixture was adjusted to have a predetermined viscosity which permits a screen printing. It was confirmed that it was unnecessary to use the metallic paste material mixed with an element of the fifth group of the periodic table as introduced with respect to the conventional technique. It should be understood that the above-mentioned metallic paste material is used in the embodiments described hereinbelow unless specifically mentioned.

Figure 11:
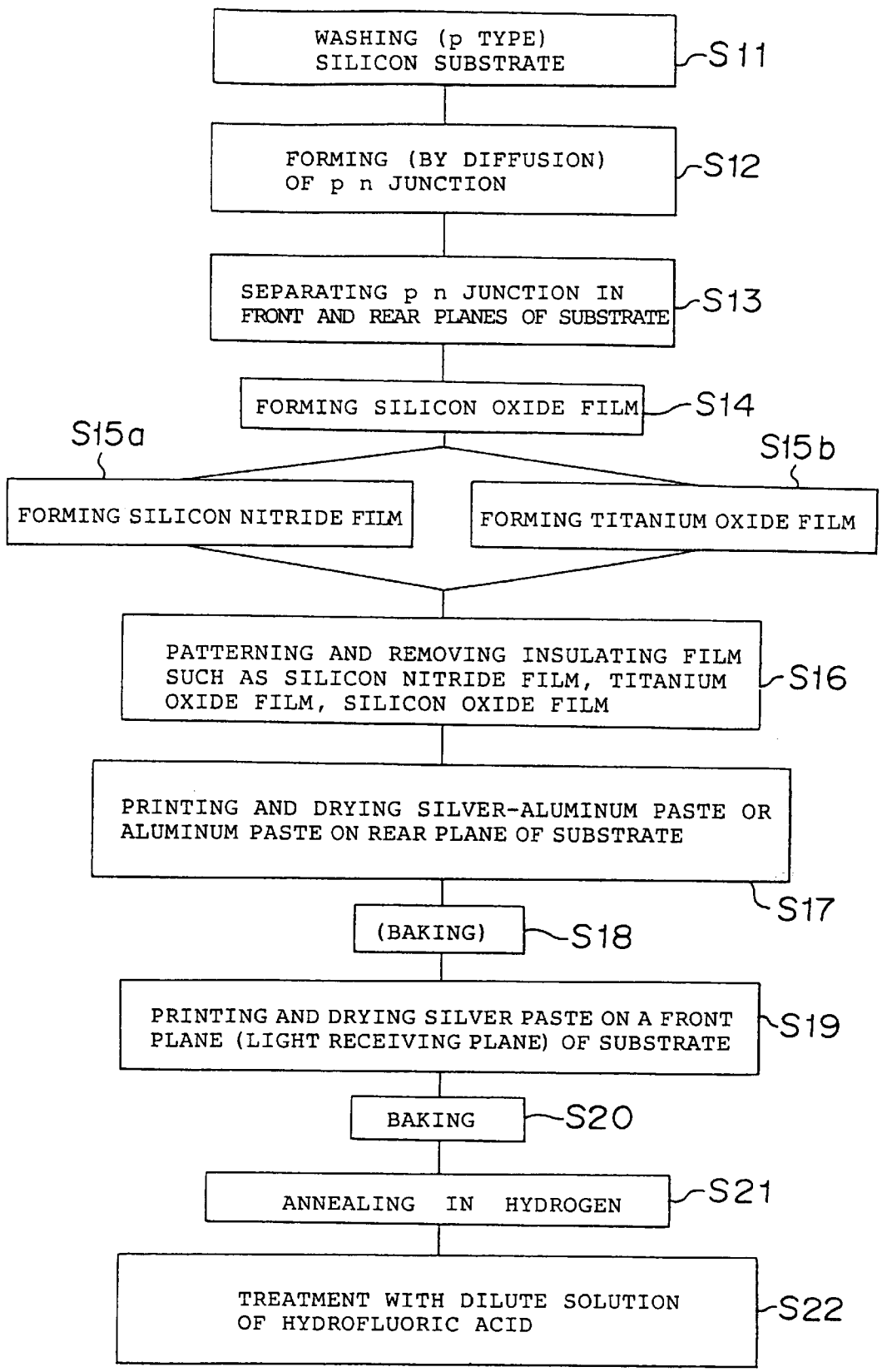
FIG. 11 is a flow chart showing a process of producing the semiconductor device according to the seventh embodiment or a ninth embodiment of the present invention.

FIG. 11 is a flow chart showing a method of producing a semiconductor device according to Embodiment 7 and Embodiment 9 which is described later.

Description will be made as to a specific example with reference to the flow chart. A solar cell is exemplified although the process flow is not in particular limited to a semiconductor device.

Figure 12:
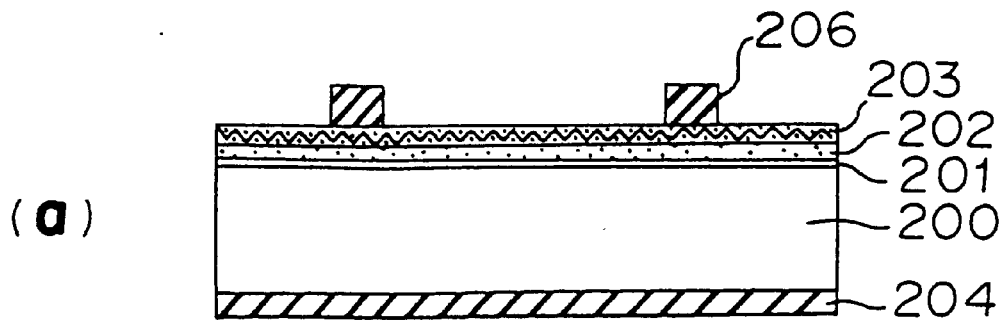
FIGS. 12a and 12b are for explaining the method of producing the semiconductor device according to the seventh embodiment of the present invention and which shows a structure of solar cell which is produced by using a firethrough penetrating technique to a structure of silicon nitride film/silicon oxide film.

In this Embodiment 7, description will be made with reference to FIG. 12 showing a cross-sectional view on a solar cell produced by a process flow comprising Step S11, Step S12, (Step S13), Step S14, Step S15a, (Step S16), Step S17, (Step S18), Step S19 and Step S20 which are shown in the flow chart in FIG. 11. In FIG. 11, bracketed steps such as (Step S13) and so on are not essentially required in the manufacturing steps of the solar cell, and indicate that the characteristics of the solar cell can further be improved by the addition of these steps, or they may be omitted in order to simplify the manufacturing process.

Step S11 in FIG. 11 indicates a step of washing a semiconductor substrate such as a single crystal silicon substrate produced by a pulling method or a polycrystal silicon substrate produced by a casting method. In a case of the solar cell, however, it is often to use substrates which have been just sliced from an ingot. In this case, in order to eliminate a damage of the substrate surface such as flaws due to a tool, e.g., a wire saw used for slicing or contamination at a wafer slicing step, the substrate surface is etched by a depth of from about 10 $\mu$m to 20 $\mu$m by using an aqueous alkali solution such as an aqueous potassium hydroxide solution, an aqueous sodium hydroxide solution or the like or a mixed liquid of hydrofluoric acid and nitric acid. Further, a step of washing with a mixed liquid of hydrochloric acid and hydrogen peroxide may be added in order to remove heavy metals such as iron deposited on the substrate surface. In FIG. 12a, numeral 20 designates a silicon substrate obtained by the above-mentioned steps.

Then, in Step S12, an n type diffusion layer 201 is formed to obtain a p n junction when the substrate used is a p type silicon substrate 200, for example. The n type diffusion layer is formed by using phosphorus oxychloride ($POCl_3$) to effect diffusion of phosphorus as described with reference to FIG. 17b. Other methods may be employed. For example, the n type silicon layer is formed by the ion implantation of phosphorus or arsenic, or the decomposition of a gas mixture comprising monosilane ($SiH_4$), disilane ($Si_2H_6$), dichlorosilane ($SiCl_2H_2$), trichlorosilane ($SiCl_3H$) or tetrachlorosilane ($SiCl_4$) and a phosphine ($PH_3$) gas as an impurity material with use of an external energy such as heat or plasma, and thus formed n type silicon layer performs the same effect as in the embodiments mentioned before. Further, silicon carbide (SiC) produced by a gas mixture of, for example, monosilane and methane or ethane may be used to obtain a hetero junction as the p n junction in order to improve the characteristics of solar cell such as control of surface recombination, a window effect and so on.

Namely, the p n junction can be formed in a simple way by using a semiconductor layer composed of a fourth group element in which the junction formed in the silicon substrate is obtained by using an element as an impurity which belongs the third group or the fifth group in the periodic table. Further, when the semiconductor layer of the fourth group element is a semiconductor layer in which an impurity is directly diffused in a silicon substrate or ions are implanted into the silicon substrate, or it has a semiconductor thin layer comprising a single element or plural elements which are accumulated on the silicon substrate by a decomposition reaction of a raw material gas by the application of heat or plasma, the impurity concentration or the thickness of the semiconductor layer can be controlled at a high accuracy. The thin layer formed by such method may be of amorphous, microcrystal, polycrystal or monocrystal by selecting conditions of forming such as temperature of film formation. Further, a quantity of doping of an impurity can be controlled. The thickness of the thin layer can be chosen to meet purposes of use in a range of from several hundred Å to several micron meters. In FIG. 12a, reference numeral 201 designates the n type diffusion layer formed by the above-mentioned method.

The separation of the p n junction in the front and rear planes of the substrate at Step S13 may be conducted according to the step as shown in FIG. 17c. In a case of choosing a process of forming the n type layer by an ion implantation or a CVD method as described with reference to Step S12, the n type layer is basically formed only in a single plane. Accordingly, the step as shown in FIG. 17c is not always necessary. Further, even in a case of using a diffusion method wherein a liquid coating material containing phosphorus, such as PSG (Phospho-Silicate-Glass) is spin-coated only on a single plane of the substrate followed by annealing at an appropriate condition, the step as shown in FIG. 17c is not always necessary. Of course, this step can be employed to increase the quality when there is a danger that the n type layer would extend to the rear plane of the substrate.

Step S14 concerns a step of forming a silicon oxide film having an appropriate thickness, for example, a thickness of from about 100 Å to 200 Å on a substrate surface (specially on the surface of the n type diffusion layer) by subjecting the substrate in which an n type diffusion layer 201 is formed as described above, to thermal oxidation by a thermal oxidation method e.g., (by heating it at 800° C. to 1000° C. in oxygen for several min). With this step, an oxide film is formed on not only the surface of the n type diffusion layer but also the opposing plane of the p type silicon substrate 200. The formation of the oxide film reduces a defect density (a surface state density) in the n type diffusion layer and the surface of the p type silicon substrate which is opposite to the n type diffusion layer to thereby control the surface recombination at the surface of the solar cell whereby the characteristics of the solar cell can be improved. This method is well known as one of the surface passivation techniques. Alternatively, a silicon oxide film may be formed by a plasma CVD method or a thermal CVD method by using a gas mixture of $SiH_4$ and $O_2$ as raw material. FIG.

12a shows a structure that a silicon oxide film 202 obtained by the above-mentioned method is formed on the n type diffusion layer 201.

Step S15a concerns a step of forming a silicon nitride film 203 (FIG. 12a). When the above-mentioned Step S14 is conducted, it is formed on the silicon oxide film 202. However, since the silicon oxide film 202 is not essentially required in the structure of the solar cell as described before, the silicon nitride film 203 may be formed directly on the n type diffusion layer 201. Since the silicon nitride film 203 functions as an antireflection film, the reflectivity at the surface of the solar cell to an incident light can be reduced whereby an electric current to be produced can be largely increased. The silicon nitride film 203 has preferably a thickness of from about 700 Å to about 800 Å which depends on a refractive index, e.g., in a case of a refractive index of from about 1.9 to about 2.0.

The silicon nitride film 203 is formed by a vacuum thermal CVD method or a plasma CVD method. When a thermal CVD method is used, the film is formed under conditions of a gas flow rate of $NH_3/SiCl_2H_2$=10 to 20, a pressure in reaction chamber of from 0.2 to 0.5 Torr and a temperature of 760° C., for example. Since such method causes decomposition at a high temperature, no hydrogen is contained in the silicon nitride film 203, and the composition ratio of Si and N is $Si_3N_4$ as substantially a stoichiometric composition, and the refractive index is in a range of from 1.96 to 1.98. Accordingly, the film produced by this method is very dense wherein the film quality (film thickness, refractive index) is not changed even when the thermal treatment is added thereafter.

When the silicon nitride film 203 is formed by the plasma CVD method, a gas mixture of $SiH_4$ and $NH_3$ is generally used as raw gas. As a suitable condition for forming the film, there are a gas flow rate of $NH_3/SiH_4$=0.5 to 1.5, a pressure in reaction chamber of 1 to 2 Torr, a temperature of from 300° C. to 550° C., and a frequency of high frequency power source necessary for causing a plasma discharge of several hundred kHz or more. The plasma CVD method requires a low temperature for forming the film in comparison with the thermal CVD method. Accordingly, the film produced by the plasma CVD method has such features that hydrogen is contained in the silicon nitride film 203 and the composition ratio of Si and N can largely be varied because the decomposition of gas is effected by plasma. Specifically, the composition ratio of Si, N and H is changed by changing conditions such as the gas flow rate, pressure, temperature and so on whereby a silicon nitride film having a refractive index of from 1.8 to 2.5 can be formed. When such silicon nitride film undergoes a heat treatment such as a step of baking electrodes in the postprocess, there is a case that the refractive index and the film thickness vary from the original values just after the formation of the film due to such a phenomenon that hydrogen escapes. In this case, the conditions of film formation should be determined in previously considering a change of the film quality due to the heat treatment in the postprocess. Thus, the silicon nitride film necessary for the solar cell is obtainable.

Explanation of Step S16 will be made later and the steps next to Step S16 will be made first.

Step S17 concerns a step of forming an electrode 204 in a predetermined pattern by a screen printing method with use of a metallic paste material of the present invention such as a silver-aluminum paste or an aluminum paste (FIG. 12a) and by drying the paste.

Step S18 concerns a step of baking the paste. In more detail, the paste is baked at 700° C. to 800° C. in dry air for several tens sec to several min whereby an ohmic contact of the electrode to the p type substrate can be obtained and a diffusion layer 205 formed by diffusing aluminum in the silicon substrate is formed (FIG. 12b).

At Step S19, the silver paste electrode 206 according to the present invention is directly printed on the silicon nitride film 203 formed on the side of the n type diffusion layer 201, and then, the silver paste electrode 206 is dried. At Step S20, the silver paste 206 is baked. However, Step S18 is unnecessary as long as the silver-aluminum paste or the aluminum paste which contains the glass composition of the present invention is used, and each material of the electrodes printed and dried at Step S17 and Step S19 is baked together at Step S20. In this embodiment, the firethrough technique to the silicon nitride film 203, which has not been achieved in the conventional technique, can easily be carried out, and after the firethrough the silver paste electrode 206 melts and penetrates the silicon nitride film 203 and the silicon oxide film 202 so that it has an electrical contact with the n type diffusion layer 201.

In this connection, detailed explanation will be made on the basis of actual experiments.

As described before, the film quality of the silicon nitride film formed by the thermal CVD method is generally denser than that of the silicon nitride film produced by the plasma CVD method, and therefore, in estimation, it would be difficult to realize the firethrough. In accordance with the present invention, however, the ohmic contact to the electrode can easily be obtained at the light receiving plane regardless of methods of forming the film.

Figure 13:
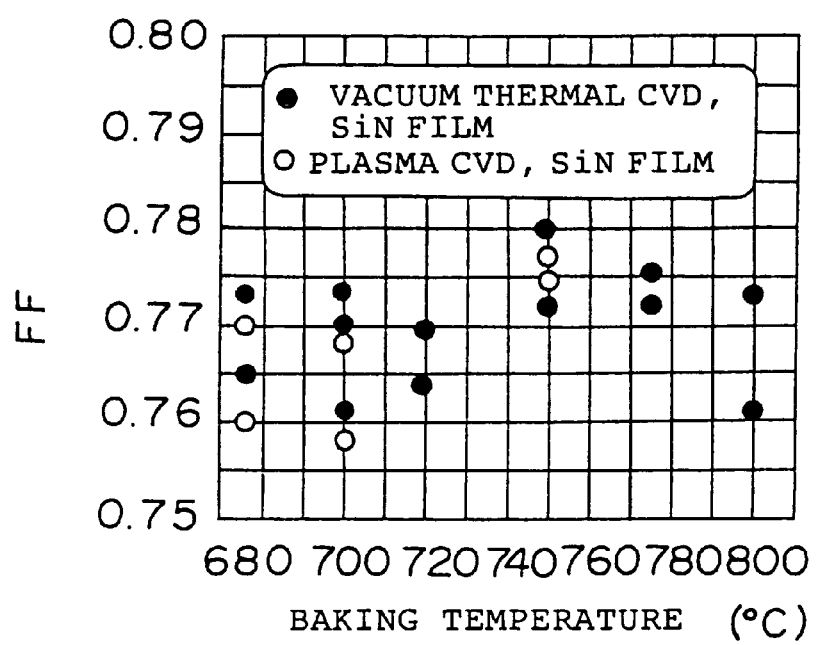
FIG. 13 is a diagram which is for explaining the method of producing the semiconductor device in accordance with the seventh embodiment of the present invention and which shows the relation between the condition for firethrough penetrating of the silicon nitride film and the fill factor of solar cell.

FIG. 13 shows experimental data of the relation of fill factors (FF) to baking temperature with respect to solar cells having the structure shown in FIG. 12, the data providing judgment as to whether an ohmic contact of sufficiently low resistance has been able to obtain by the firethrough.

In the solar cells used for the experiments, the semiconductor substrate was of polycrystal silicon by a casting method; the n type diffusion layer 201 was formed by a phosphorus diffusing method with use of phosphorous oxychloride ($POCl_3$); and the silicon oxide film 202 was formed by a thermal oxidation method. And in forming the silicon nitride film 203, both the plasma CVD method and the vacuum thermal CVD method were used. The electrodes 204 and 206 as shown in FIG. 12a were simultaneously baked in dry air. The time of baking was 45 sec at the peak value of baking temperature of 675° C., 45 sec at 700° C., 22 sec at 720° C.–750° C. and 10 sec at 775° C.–800° C. respectively. The size of the solar cells was 10 cm×10 cm. As shown in FIG. 13, a fill factor of 0.76 or more can be obtained in the solar cells of a practical size of 10 cm×10 cm, and the effectiveness of the present invention could be confirmed.

The refractive index and the film thickness of the silicon nitride film 203 formed by the plasma CVD method as shown in FIG. 12 are 2.1 and 750 Å respectively. However, it was confirmed that the same result could be obtained to films having refractive indices of 1.9, 2.0, 2.2, 2.3 and 2.4.

Now, explanation of Step S16 will be made. This step is conducted in assumption of the situation described as follows. In a case that the silicon nitride film 203 is formed by a vacuum CVD method for example, the substrate is often fixed at only a part of its peripheral portion. In this case, the silicon nitride film 203 is formed in not only a single plane as shown in FIG. 12 but also in the opposite plane. The silicon nitride film formed in the opposite plane may be a bar in forming the electrode 204 at the rear plane. Namely, it prohibits an electrical contact to the substrate 200 unless the firethrough is successful.

Accordingly, in order to avoid such situation, Step S16 is provided so that the electrode is formed after a part or the entire portion of the silicon nitride film formed partly or entirely on the opposite plane has been removed to obtain an electrical contact to the substrate 200. However, Step S16 is not always necessary since it has been confirmed that the firethrough of the silicon nitride film 203 could be effected under the above-mentioned baking conditions when the silver-aluminum paste or the aluminum paste of the present invention is utilized. Further, it was also confirmed that the firethrough could be successful as well even when the silicon nitride film to be formed by the plasma CVD method extends at the rear plane side. In the present invention, solar cells can be produced without necessitating the patterning steps even in a case that the silicon nitride film is formed intentionally or inevitably in both planes of the substrate.

EMBODIMENT 8

In Embodiment 8, description will be made as to Step S21 and Step S22 in the process shown in FIG. 11, which are taken subsequent to the steps in Embodiment 7. In particular, Step S22 is a featured step in the present invention wherein the solar cell having been subjected to Step S20 is dipped in an aqueous solution of hydrofluoric acid (HF). After the dipping, the solar cell is sufficiently washed with pure water and then, dried.

Figure 14:
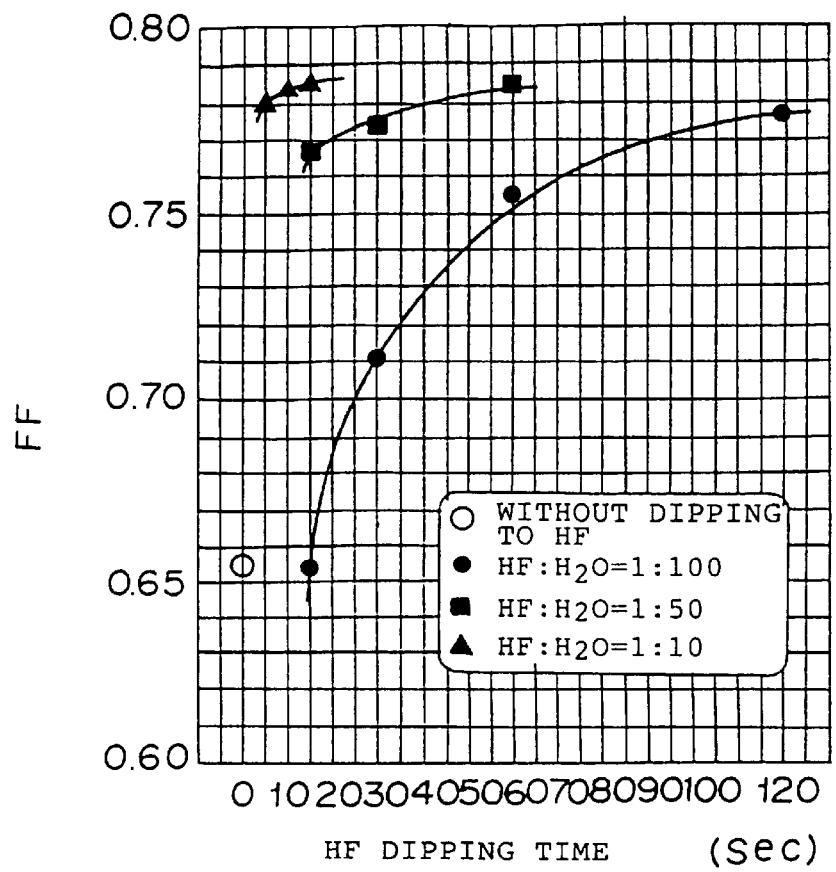
FIG. 14 is a diagram which is for explaining an eighth embodiment of the present invention and which shows the relation between the condition for a hydrofluoric acid treatment and the fill factor of solar cell.

FIG. 14 shows a result of actual experiments of solar cells wherein the silicon nitride film 203 is formed by a vacuum thermal CVD method. As baking conditions, baking was conducted at 720° C. for 5 min, which is longer than that of Embodiment 7. A white circle in FIG. 14 indicates the fill factor value just after the baking. The value was very low as about 0.65. On the other hand, when the solar cells under the same condition were dipped in an aqueous solution of hydrofluoric acid under various conditions as shown in FIG. 14, a substantial improvement was found (as indicated by black circles in FIG. 14).

Other experiments were conducted in order to understand this phenomenon. As a result, the following fact was found. Namely, while the specific resistance of the electrode 206 (FIG. 12b) itself before and after the dipping treatment in the aqueous solution of hydrofluoric acid was $3\times10^{-3}$ Ωcm, i.e., the specific resistance did not show a change, the contact resistivity, which was $2.68\times10^{-1}$ Ωcm$^2$ before the treatment, was reduced by two orders as $2.60\times10^{-3}$ Ωcm$^2$ after the treatment. The improvement of the fill factor would be able to obtain by the fact as follows. When the firethrough of the silicon nitride film 203 is effected, a glass component which increases the contact resistance, may deposit on the interface between the electrode 206 (FIG. 12b) and the n type diffusion layer depending on the baking conditions. However, the glass component can be removed during the hydrofluoric acid dipping treatment.

According to this method, a solar cell can be produced under very wide conditions of baking the electrode in a case of forming the electrode by the firethrough of the silicon nitride film 203, and the method is very unique in improving yield of production. Further, in this method, a completed solar cell is dipped in an aqueous hydrofluoric acid solution. Accordingly, someone may wonder that the silicon nitride film as an antireflection film is etched. However, the silicon nitride film formed by the thermal CVD method or the plasma CVD method was etched under the conditions shown in FIG. 14, and a change of the reflectivity of the solar cells in an appropriate manner was not observed at all.

Further, it was confirmed in this step that the adhering strength of the electrode did not largely reduced and there was no problem in producing a solar cell module by using the ordinary method.

In this Embodiment 8, annealing in hydrogen at Step S21 contributes to reduce the surface state density between the silicon nitride film 203 or the silicon oxide film 202 and the n type diffusion layer 201. For example, the annealing is conducted at 400° C. to 450° C. for 30 min with use of a gas mixture of hydrogen:nitrogen=1:9. As a result of the experiments, it was confirmed that an open voltage of 587 mV before the annealing became 596 mV after the annealing.

It was also confirmed that the exchanging of the order of the Step S21 and Step S22 did not influence the final characteristics of the solar cell.

Description has been made as to the case of using hydrofluoric acid. However, an etching liquid capable of fusing the glass component may be used. For example, the same effect is obtainable even by using an aqueous ammonium fluoride solution.

EMBODIMENT 9

In this embodiment, description will be made as to a solar cell produced by the flow of Step S11, Step S12, Step S13, Step S14, Step S15b, (Step S16), Step S17, (Step S18), Step S19 and Step S20 in the flow chart shown in FIG. 11.

Figure 15:
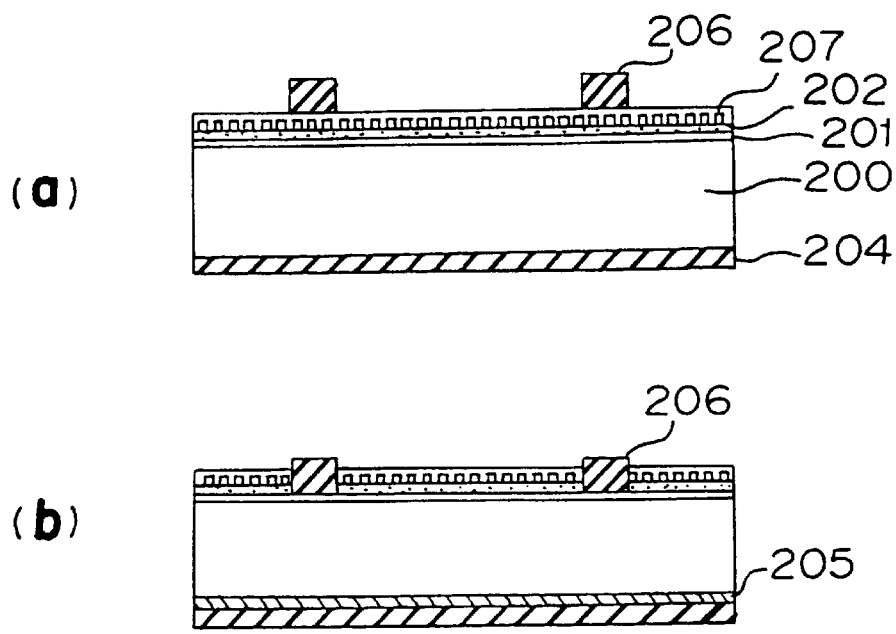
FIGS. 15(a) and 15(b) are cross-sectional views which is for explaining a method of producing a semiconductor device according to a ninth embodiment of the present invention and which shows a structure of a solar cell produced by using a firethrough penetrating technique to a structure of titanium oxide film/silicon oxide film.

FIGS. 12a and 12b are diagrams showing in cross section a characteristic feature of the solar cell produced by the process of this embodiment. Since all the steps except for Step S15b are the same as those described with respect to Embodiment 7, description is omitted. In Embodiment 9, however, Step S13 is essential. Step S15b concerns a step of forming a titanium oxide film 207 as shown in FIG. 15. The titanium oxide film 207 can be formed by coating an organic titanate (an organic liquid material containing titanium) represented by TPT (tetra-i-propyltitanate) on a substrate, followed by baking. When the organic titanate is coated by a spin coating method, the thickness of film should be controlled by adjusting a quantity of TPT, the number of revolution and time. After the baking, the film thickness is reduced due to volume reduction. However, the film thickness after baking should be adjusted to have a thickness of from about 700 Å to 800 Å. Temperature for baking and time are, for example, 300° C. to 400° C. and several min to 30 min respectively. Alternatively, the titanium oxide film 207 can be formed by thermal decomposition at 250° C. to 300° C. with use of a mixture of TPT vapor and a water vapor (a thermal CVD method). By using the above-mentioned method, the film having a refractively index of from about 2.0 to 2.3 can be obtained.

Figure 16:
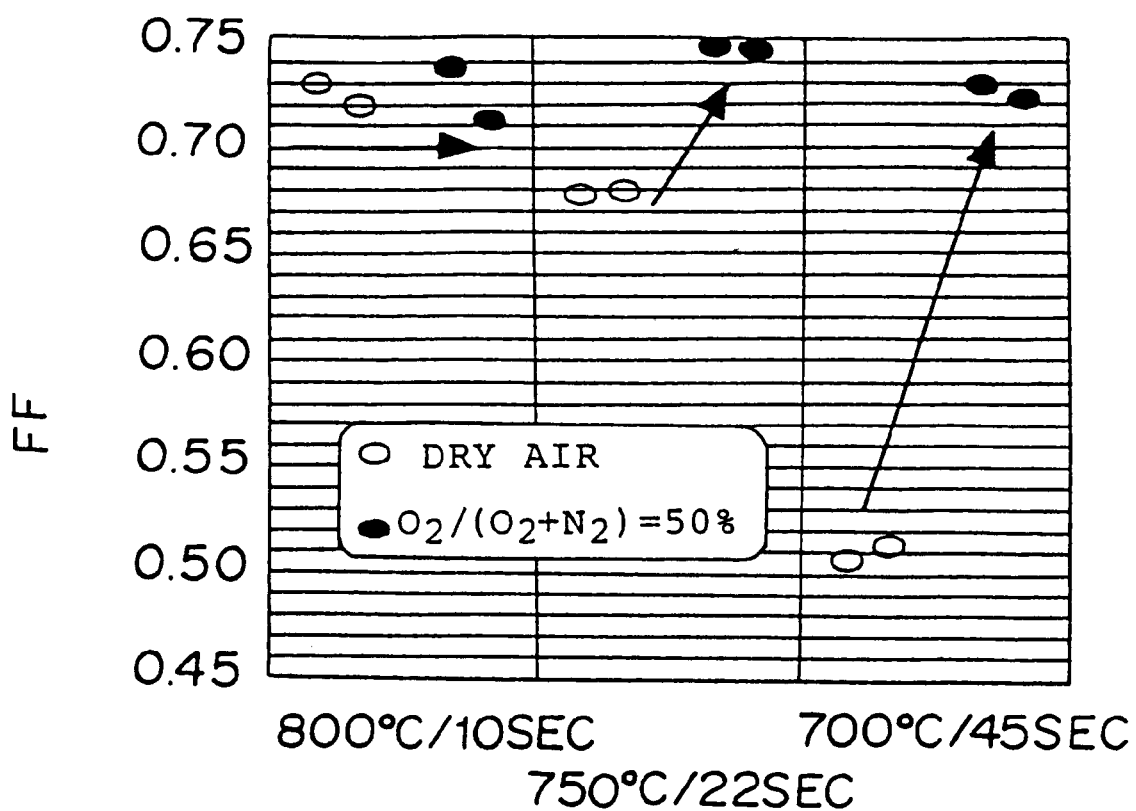
FIG. 16 is a diagram which is for explaining the method of producing the semiconductor device according to the ninth embodiment of the present invention and which shows the relation between the condition for baking by using a firethrough penetrating technique to the structure of titanium oxide film/silicon oxide film.

The reason why the silicon oxide film 202 is formed at Step S13 is as follows. As described before, it reduces a defect of density in the wafer surface. However, it is in particular effective to provide a double-layer structure of silicon oxide film/titanium oxide film in a solar cell using the titanium oxide film 207 as an antireflection film. It is because that when the titanium oxide film 207 is directly formed on the semiconductor substrate by the above-mentioned method, there is-a high possibility of defect density at the interface between the titanium oxide film 207 and the the semiconductor substrate (i.e., the n type diffusion layer 201), and the conversion efficiency of the solar cell is adversely effected. In this embodiment, the firethrough of the electrode 206 (FIG. 15b) can easily be effected even to the insulating film of double-layer structure of silicon oxide film 202/titanium oxide film 207 as shown in FIG. 15. A result of experiments has revealed that the conditions were very characteristic (FIG. 16).

Generally, a metallic paste material is baked in dry air. However, with respect to the construction of the present invention, it is understood that a concentration of oxygen (a gas mixture of oxygen and nitrogen) is an important point as shown in FIG. 16. For example, when the metallic paste material is baked at a high temperature such as 800° C., a high fill factor (FF) can be obtained even in the ordinary dry air. However, when the baking temperature is low, a high fill factor (FF) can not be obtained in the dry air. On the other hand, when the oxygen concentration is rendered to be, for example, 50%, a high fill factor FF can be obtained. As a systematic experiment, it has been confirmed that a high fill factor FF has been able to obtain in a range of baking temperature of from about 700° C. to 800° C. when the oxygen concentration is 30% or more.

It has also been confirmed that the hydrofluoric acid dipping treatment at Step S22 (FIG. 11) described with respect to Embodiment 8 is effective in improving the fill factor FF in this embodiment, although the detail is not shown in drawings. For example, a fill factor of 0.68 at stages up to Step S20 could be improved to 0.75 by dipping the electrode material in a solution of $HF:H_2O=1:50$.

As described above, the method of producing a solar cell according to the present invention can realize the electrical separation of the p n junction necessary for forming the solar cell in a very simple manner. Accordingly, it is possible to drastically improve manufacturing cost and productivity on a silicon solar cell.

In particular, the electrical separation of the p n junction can be realized, without conducting a conventional chemically etching treatment, by forming a material composed mainly of glass which has a nature of fusing silicon on the p n junction, followed by baking. Accordingly, the manufacturing process of the solar cell can substantially be shortened to thereby reduce manufacturing cost.

A thin layer formed on a silicon layer has a thickness of from several hundred Å to several micron meters, which is formed by thermal diffusion of an impurity, ion implantation, or decomposition of a raw gas by the application of an external energy such as heat or plasma. Accordingly, the p n junction can be formed with good controllability and high reproducibility.

Since the material composed mainly of glass is in a paste-like form which is suitable for coating and patterning, a desired pattern can be formed.

Further, since the material composed mainly of glass is capable of electrically separating the p n junction and of leaving the p n junction at the position where it has been originally formed, without removing it, the manufacturing process can be simplified and a possibility of contamination of the solar cell can be reduced.

The method of producing a solar cell of the present invention further comprises a step of removing the material composed mainly of glass, which is conducted after the p n junction has been electrically separated by baking the material composed mainly of glass. Accordingly, accuracy of patterning the electrodes can be improved.

The method of the present invention further comprises a step of forming a p electrode and an n electrode, which are necessary to collect power in the solar cell, in a region other than the region of p n junction where the material composed mainly of glass is formed. Accordingly, there is no stress of the material composed mainly of glass to the electrodes and mixing of an impurity is avoidable.

The step of forming the p electrode and the n electrode is conducted after the formation of the material composed mainly of glass. Accordingly, the conditions of forming the electrodes can be determined independent of the conditions of forming the material composed mainly of glass. Namely, the conditions for the formation can easily be optimized.

The step of forming the p electrode and the n electrode is conducted before the formation of the material composed mainly of glass. Accordingly, the conditions of forming the electrodes can be determined independent of the conditions of forming the material composed mainly of glass. Namely, the conditions of the formation can easily be optimized.

A combination of materials selected from the group consisting of a silver paste, an aluminum-silver paste and an aluminum paste is used for the p electrode and the n electrode. Accordingly, the paste material can be used together with the material composed mainly of glass whereby the method is highly productive.

The p electrode and the n electrode are formed on a front surface or both a front surface and a rear surface where the p n junction is or are provided, and the p electrode and the n electrode are baked at the same time of baking the material composed mainly of glass. Accordingly, the method is highly productive.

The p electrode and the n electrode are formed on a front surface or both a front surface and a rear surface where the p n junction is or are provided, and the p electrode and the n electrode are baked after the step of baking the material composed mainly of glass. Accordingly, the conditions of forming the electrodes can be determined independent of the conditions of forming the material composed mainly of glass. Namely, the conditions of the formation can easily be optimized.

The step of baking the p electrode and the n electrode is conducted after the removal of the material composed mainly of glass which has been subjecting to baking. Accordingly, the conditions of forming and the electrode can be determined independent of the conditions of forming the material composed mainly of glass. Namely, the conditions of the formation can easily be optimized.

The p electrode and the n electrode are formed on a front surface or both a front surface and a rear surface where the p n junction is or are provided, and the p electrode and the n electrode are baked before the step of baking the material composed mainly of glass. Accordingly, the conditions of forming the electrodes can be determined independent of the conditions of forming the material composed mainly of glass. Namely, the conditions of the formation can easily be optimized.

The material composed mainly of glass is provided on a plane where the p n junction is formed, in a form of pattern by using a screen printing or roll coater printing. Accordingly, the patterning can be done in a short time to thereby increase productivity.

The material for the p electrode and the n electrode is provided on the p n junction in a form of pattern by using a screen printing or a roll coater printing.

Accordingly, the patterning can be done in a short time to thereby increase productivity.

A solar cell according to the present invention has a p n junction which comprises a substrate and a thin layer of an electrical conductive type opposite to that of the substrate which is formed on a front surface, or both a front surface and a rear surface, or the entire surface including edges of the substrate, and a p type electrode and an n type electrode which are formed on the p n junction, wherein a material composed mainly of glass which is capable of electrically separating the p n junction, is provided between the p type electrode and the n type electrode. Accordingly, the solar cell can realize electric separation of the p electrode from the n electrode with a simple structure and has excellent characteristics comparable with a conventional solar cell.

A method of producing a semiconductor device according to the present invention comprises a step of forming an insulating film on a front surface or both a front surface and a rear surface of a semiconductor substrate having a junction and a step of forming an electrode which penetrates the insulating film to electrically contact with- the semiconductor substrate by providing on the insulating film a metallic paste material containing glass which has a property of melting the insulating film, followed by baking the material. Accordingly, it is possible to form electrodes capable of substantially reducing the contact resistance to the semiconductor substrate by applying the same physical phenomenon as in the method of electrically separating the p n junction in forming the electrodes in a solar cell.

According to the method of producing a semiconductor device, a firethrough phenomenon is obtainable in either case that the insulating film is constituted by a single layer composed of a silicon nitride film or a plurality of layers wherein at least one layer is a silicon nitride film, and the contact resistance to the semiconductor substrate can largely be reduced. In particular, a construction body in which an insulating film composed mainly of a silicon nitride film is formed on a main surface or both a main surface and the opposing surface of the semiconductor substrate having a junction, is used and when a metallic paste material containing glass which has a property of fusing silicon nitride is formed to have a predetermined shape at a predetermined position on the film, followed by baking, the electrode thus formed melts and penetrates the silicon nitride film to obtain electrical contact with the semiconductor substrate. Accordingly, any step of patterning and etching the silicon nitride film to meet an electrode pattern can be omitted whereby manufacturing cost can remarkably be reduced.

The insulating film constituted by a plurality of layers includes a silicon oxide film in addition to the silicon nitride film. Thus, the insulating film having a two-layered structure of the silicon nitride film and the silicon oxide film can control the surface recombination of carriers at the surface of the semiconductor device.

Further, the silicon nitride film is formed by a thermal CVD method or a plasma CVD method whereby the film thickness and the refractive index can easily be controlled, and a predetermined structure for the semiconductor device is easily be obtainable.

Further, when the insulating film is constituted by a plurality of layers wherein there is at least one titanium oxide film, and when a metallic paste material containing glass which has a property capable of melting the insulating film is formed to have a predetermined shape at a predetermined position on the titanium oxide film, followed by baking, the electrode melts and penetrates the insulating film to thereby obtain electrical contact with the semiconductor substrate. Accordingly, any step of patterning and etching the insulating film to meet an electrode pattern can be omitted to thereby reduce manufacturing cost.

Further, when the oxide film has a two-layered structure of a titanium oxide film and a silicon oxide film, there is effect of controlling the recombination of carriers at the surface of the semiconductor device. In the abovementioned method of producing a semiconductor device, since the titanium oxide film is formed by coating an organic liquid material containing titanium on the semiconductor substrate followed by baking, or is formed by a thermal CVD method, productivity can be increased.

Further, in the semiconductor device comprising the insulating film having a two-layered structure of the titanium oxide film and the silicon oxide film, the metallic paste material is baked in an atmosphere of a gas mixture of oxygen and nitrogen in which the concentration of oxygen is 30% or more. Accordingly, the contact resistance between the electrode and the semiconductor substrate can remarkably be reduced.

Further, the silicon oxide film is formed by a thermal oxidation method, a thermal CVD method or a plasma CVD method whereby a silicon oxide film of high quality can be obtained.

Further, since glass in the metallic paste material contains as major components lead, boron, silicon and oxygen, the insulating film comprising various types of layers can easily be molten at the baking of the metallic paste material to thereby obtain electrical contact with the semiconductor as a result of a firethrough effect.

The metallic paste material comprises at least one member selected from the group consisting of a silver paste, a silver-aluminum paste including aluminum and an aluminum paste. Accordingly, all the electrodes can obtain electrical contact by a firethrough effect.

Since the semiconductor substrate is a single crystal silicon substrate or a polycrystal silicon substrate, a large scale production is possible and manufacturing cost of a semiconductor device can be reduced.

The junction in the silicon substrate is formed by using a semiconductor layer made of a fourth group element of the periodic table, which contains as an impurity an element belonging to the third group or the fifth group. Accordingly, the p n junction can be formed by a simple method.

Further, the semiconductor layer of the fourth group is a semiconductor layer formed by diffusing an impurity or by ion implantation to a silicon substrate, or the thin semiconductor layer comprising a single element or plural elements which are deposited by a decomposition reaction of a raw material gas or a gas mixture in the silicon substrate by means of heat or plasma. Accordingly, the concentration of an impurity and the thickness of the semiconductor layer can be controlled with high accuracy.

The method of producing a semiconductor device further comprises a step of dipping the semiconductor substrate in an aqueous solution containing hydrofluoric acid or ammonium fluoride after the step of forming the electrode by baking the metallic paste material to allow the penetration of the material through the insulating film to electrically contact with the semiconductor substrate. Accordingly, the contact resistance of the electrode to the semiconductor can remarkably be reduced.

The method of producing a semiconductor device further comprises a step of conducting a heat treatment in an atmosphere containing hydrogen, before or after the step of dipping the semiconductor substrate in an aqueous solution containing hydrofluoric acid or ammonium fluoride. Accordingly, the surface recombination in the semiconductor device can further be controlled.

Obviously, numerous modifications and variations of the present invention are possible in light of the above teachings. It is therefore to be understood that within the scope of the appended claims, the invention may be practiced otherwise than as specifically described herein.

What is claimed is:

1. A solar cell which comprises a p n junction comprising a substrate and a thin layer of an electrical conductive type opposite to that of the substrate which is formed on a front surface, or both a front surface and a rear surface, or the entire surface including edges of the substrate, and a p type electrode and an n type electrode which are formed on the p n junction, the solar cell being characterized in that a material comprising glass which is capable of electrically separating the p n junction, is provided wholly between the p type electrode and the n type electrode.

2. The solar cell according to claim 1, wherein the p-type electrode contains aluminum and silver.

3. The solar cell according to claim 1, wherein the glass material has a width of 0.5 mm–2 mm.

4. The solar cell according to claim 1, wherein the solar cell further comprises an antireflection film selected from the group consisting of silicon nitride, titanium oxide, silicon oxide, and a double layer of titanium oxide and silicon oxide.

5. The solar cell according to claim 4, wherein the antireflection film has a thickness of several hundred Å to 1000 Å.

6. The solar cell according to claim 4, wherein the antireflection film is a double layer of titanium oxide and silicon oxide.

7. The solar cell according to claim 1, wherein the substrate layer contains viaholes.

8. The solar cell according to claim 1, wherein the glass material comprises 5–30% Pb, 5–10% B, 5–15% Si and 30–60% O.

9. The solar cell according to claim 1, wherein the material comprising glass extends about 0.5 microns into the substrate.

* * * * *